United States Patent
Norling et al.

(10) Patent No.: US 10,491,207 B2
(45) Date of Patent: Nov. 26, 2019

(54) METHOD OF OVER CURRENT AND OVER VOLTAGE PROTECTION OF A POWER SWITCH IN COMBINATION WITH REGULATED DI/DT AND DV/DT

(71) Applicant: Infineon Technologies Austria AG, Villach (AT)

(72) Inventors: Karl Norling, Villach (AT); Johannes Groeger, Blaubeuren (DE); Anton Mauder, Kolbermoor (DE); Bernhard Wicht, Reutlingen (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/697,973

(22) Filed: Sep. 7, 2017

(65) Prior Publication Data
US 2019/0074827 A1    Mar. 7, 2019

(51) Int. Cl.
| H03K 17/082 | (2006.01) |
| H01L 21/02 | (2006.01) |
| H01L 29/24 | (2006.01) |
| H03K 17/16 | (2006.01) |
| H01L 29/786 | (2006.01) |

(52) U.S. Cl.
CPC ... *H03K 17/0828* (2013.01); *H01L 21/02472* (2013.01); *H01L 21/02565* (2013.01); *H01L 29/247* (2013.01); *H03K 17/0826* (2013.01); *H03K 17/165* (2013.01); *H03K 17/168* (2013.01); *H01L 29/78693* (2013.01); *H03K 2217/0027* (2013.01)

(58) Field of Classification Search
CPC ........ H03K 17/0828; H03K 2217/0027; H01L 21/02565; H01L 21/02472; H01L 29/247; H01L 29/78693
USPC ......... 327/108–110; 323/271, 282–285, 311; 336/200, 212, 223, 178, 175, 232
See application file for complete search history.

(56) References Cited

U.S. PATENT DOCUMENTS

| 6,330,143 B1 | 12/2001 | Maly et al. | |
| 2014/0203846 A1* | 7/2014 | Janschitz | H03K 17/166 327/109 |
| 2014/0368240 A1* | 12/2014 | Shelton | H03K 17/0822 327/109 |

OTHER PUBLICATIONS

Hain, S. et al.; "New Ultra Fast Short Circuit Detection Method Without Using the Desaturation Process of the Power Semiconductor"; Topics: 3.2 Gate Drive Units, Intelligent Integrated Drivers; Prefered Presentation Form: Oral Presentationp; Abstract for PCIM Europe 2016 3 pages.

(Continued)

*Primary Examiner* — Yusef A Ahmed
*Assistant Examiner* — Bryan R Perez
(74) *Attorney, Agent, or Firm* — Slater Matsil, LLP

(57) ABSTRACT

A method for protecting a power switch during turn-on includes sensing that a change in current through the power switch is in regulation, measuring a time that the change in current through the power switch is in regulation, and comparing the time that the change in current through the power switch is in regulation to a reference time. An over current signal, which can be used to disable the power switch, is generated if the time that the change in current through the power switch is in excess of the reference time.

18 Claims, 16 Drawing Sheets

(56) References Cited

OTHER PUBLICATIONS

Horiguchi, T. et al.; "A Short Circuit Protection Method Based on a Gate Charge Characteristic"; The 2014 International Power Electronics Conference; Advanced Technology R&D Center, et al.; 7 pages.
Lobsiger, Y. et al.; "Closed-Loop di/dt and dv/dt IGBT Gate Driver"; IEEE Transactions on Power Electronics, vol. 30, No. 6, Jun. 2015; 16 pages.
Lutz, J. et al.; "Short Circuit III in High Power IGBTs"; Chemnitz University of Technology, Chair of Power Electronics and EMC; GE Global Research; Sep. 2009; 8 pages.
Oinonen, M. et al.; "Current Measurement and Short-Circuit Protection of an IGBT based on Module Parasitics"; Aalto University; Aug. 2014; 9 pages.

\* cited by examiner

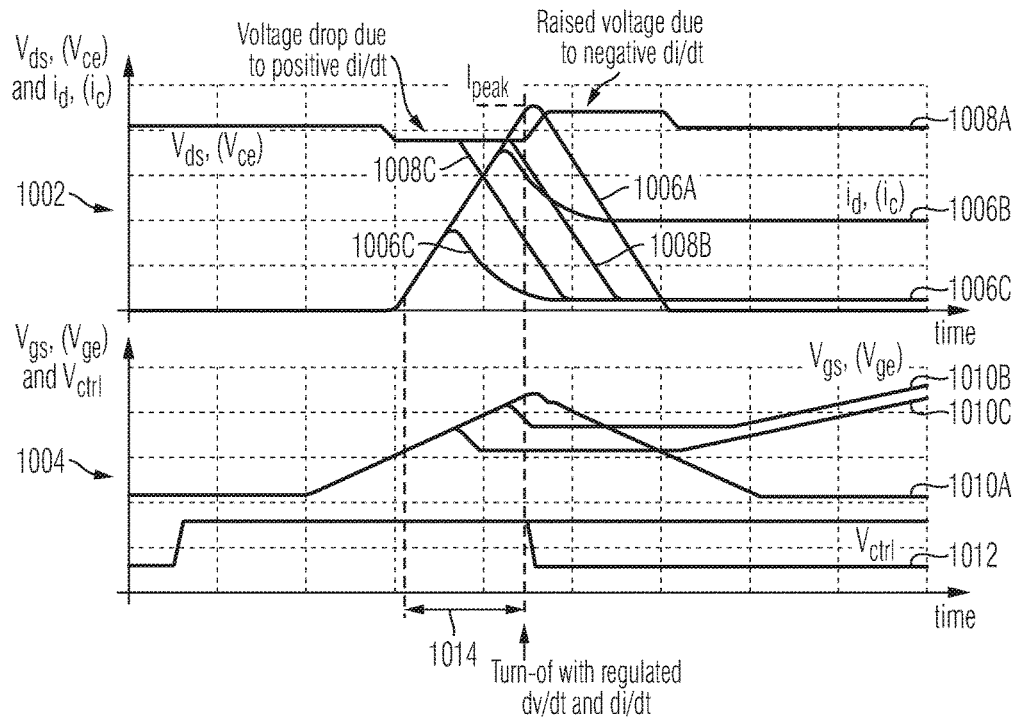
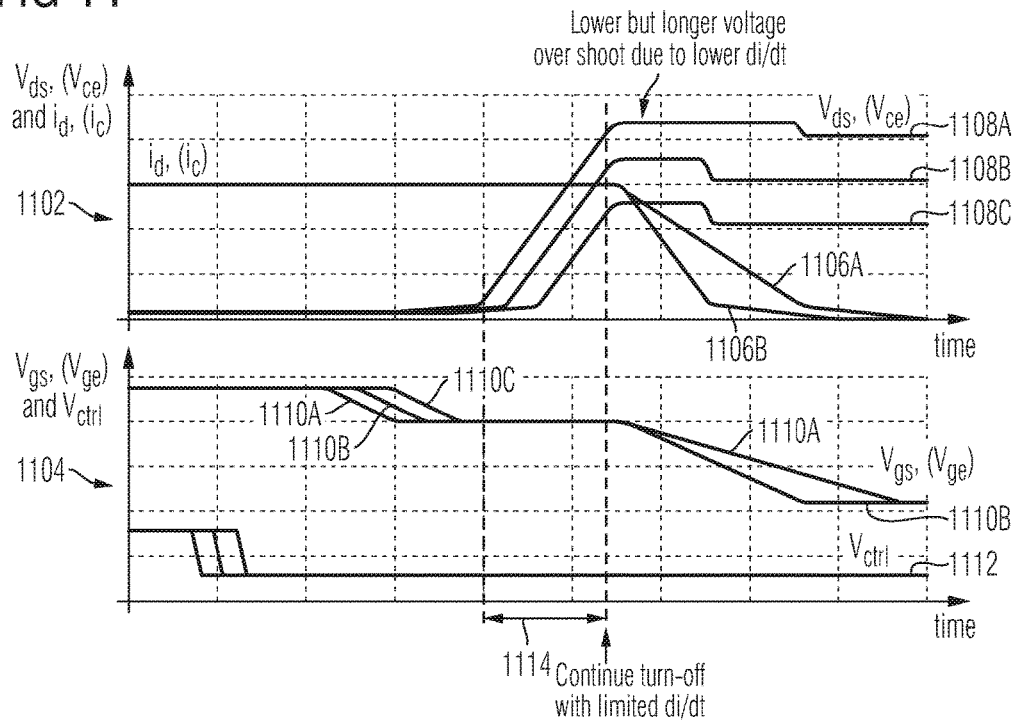

METHOD OF OVER CURRENT AND OVER VOLTAGE PROTECTION OF A POWER SWITCH IN COMBINATION WITH REGULATED DI/DT AND DV/DT

TECHNICAL FIELD

The present invention relates generally to a system and method of over current and over voltage protection of a power switch in combination with regulated di/dt and dv/dt.

BACKGROUND

Power converters use various types of power switches. The output of these power converters can either experience a short circuit or an overload condition. While protection circuits for dealing with short circuits and over voltage conditions are known, it is important to detect these conditions as soon as possible in order to minimize power dissipation in the power switches. Existing protection circuits can have a relatively slow reaction time and may not be able to prevent an internal temperature rising to a level that can could permanently damage or destroy the power switch.

SUMMARY

In accordance with an embodiment of the invention, a circuit for protecting a power switch comprises first, second, and third power switch nodes, a feedback circuit coupled to at least one of the power switch nodes for regulating a change in current through the power switch, and a detector circuit coupled to the feedback circuit having an output for identifying that the power switch is in regulation of the change in current through the power switch. The detector circuit can comprise an additional output for identifying a level of regulation of the change in current through the power switch. A timing circuit is coupled to the detector circuit having an output for generating an over current signal. The circuit may further comprise an additional feedback circuit coupled to at least two of the power switch nodes for regulating a change in voltage across the power switch. An additional detector circuit is coupled to the additional feedback circuit having an output for identifying that the power switch is in regulation of the change in voltage across the power switch. The additional detector circuit can comprises an additional output for identifying a level of regulation of the change in voltage across the power switch. An additional timing circuit is coupled to the additional detector circuit, which has an output for generating an over voltage signal. The circuit can be integrated with the power switch in a common integrated circuit or circuit board, or the power switch can be external to and remote from the other circuit components.

In accordance with another embodiment of the invention, a method for protecting a power switch comprises sensing that a change in current through the power switch is in regulation, measuring a time that the change in current through the power switch is in regulation, and comparing the time that the change in current through the power switch is in regulation to a reference time. The method further comprises generating an over current signal if the time that the change in current through the power switch is in excess of the reference time. The method further comprises turning off the power switch in response to the over current signal. Sensing that the change in current through the power is in regulation occurs concurrently with a turn-on event. The method can further comprise sensing that a voltage across the power switch is in regulation.

In accordance with another embodiment of the invention, a method for protecting a power switch comprises sensing that a change in voltage across the power switch is in regulation, measuring a time that the change in voltage across the power switch is in regulation; and comparing the time that the change in voltage across the power switch is in regulation to a reference time. The method further comprises generating an over voltage signal if the time that the change in voltage across the power switch is in excess of the reference time. The method further comprises changing a target value of a change in current through the power switch in response to the over voltage signal and also counting a plurality of over voltage signals. Sensing that the change in voltage across the power switch is in regulation occurs concurrently with a turn-off event.

BRIEF DESCRIPTION OF THE DRAWINGS

For a more complete understanding of the invention, and the advantages thereof, reference is now made to the following descriptions taken in conjunction with the accompanying drawings, in which:

FIG. 10 is a timing diagram showing over current protection waveforms at turn-on according to a method of the invention;

FIG. 11 is a timing diagram showing over voltage protection waveforms at turn-off according to a method of the invention;

DETAILED DESCRIPTION OF ILLUSTRATIVE EMBODIMENTS

FIG. 1 through FIG. 7 generally describes regulation of the change in voltage (dv/dt regulation) and regulation of the change in current (di/dt regulation) of a power switch as is described in German patent application DE 102016111449.9 filed on Jun. 22, 2016. The description of FIG. 1 through FIG. 7 provides the environment for the short circuit and overload protection features of embodiments of the invention. The detailed description of embodiments of the invention is made with reference to FIG. 8 through FIG. 24. In embodiments of the present invention, a power switch is configured to include both di/dt and dv/dt regulation, and is further configured to detect short circuit and overload conditions by timing the duration during which di/dt remains in regulation during a turn-on condition, and by timing the duration during which dv/dt remains in regulation during a turn-off condition. Other short circuit and overload detection features are described according to embodiments of the invention with respect to FIG. 8 through FIG. 24.

In simple common driver circuits, which primarily limit the voltage overshoot during turn-off, feedback signals act directly on the control terminals of semiconductor devices, e.g., their gates. As the feedback signals require a certain amount of current to generate effective changes of the voltages at the gates when acting against low gate resistors (less than 1 Ohm to some Ohms), this direct feedback structure is unfavorable. In other common driver circuits, the feedback currents are lower as they act on the inputs of power amplifier stages that directly drive the gates of the semiconductor devices. The input impedance at the input of the power amplifier stage, at which the feedback current has to generate voltage, is up to several magnitudes higher than the one at the control terminals of the semiconductor device, e.g., the gate resistor. Such driver circuits commonly use discrete transistors connected as current amplifiers, e.g., in an emitter follower type configuration. For high current amplification, two or three amplifier stages may be required, e.g., in a Darlington configuration. To evaluate voltage changes per time dv/dt and/or current changes per time di/dt, standard passive discrete components are commonly employed.

Figure 1:
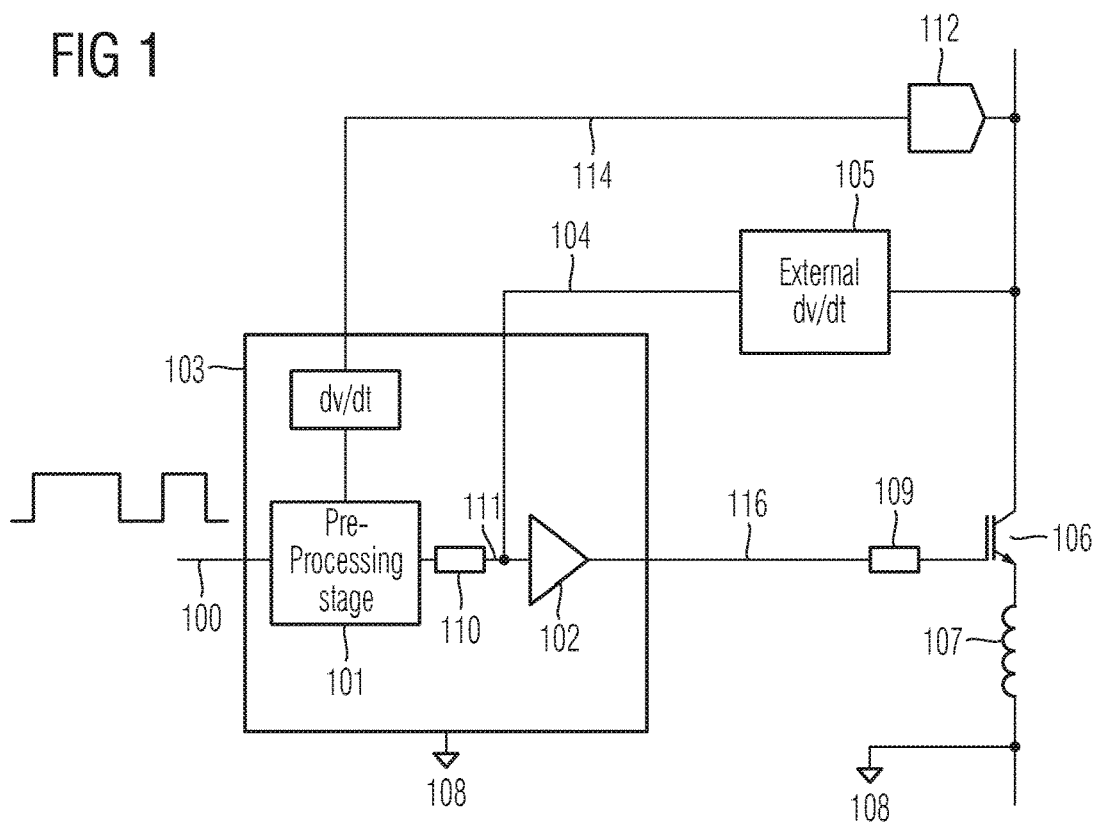
FIG. 1 is a schematic diagram illustrating an exemplary driver circuit without an external output boost circuit and with an integrated circuit having analog and digital dv/dt feedback paths.

FIG. 1 shows an exemplary driver circuit for driving a controllable semiconductor device 106, e.g., an insulated-gate bipolar transistor (IGBT) or any other appropriate semiconductor device. An emitter of semiconductor device 106 may be connected via a parasitic inductance 107 to ground 108 and its collector is connected to a load (not shown). The load path of semiconductor device 106 is the path between its emitter and collector and may include the parasitic inductance 107. The driver circuit receives an external control signal such as a control input signal 100 and includes a signal pre-processing stage 101 and a subsequent signal post-processing stage 102 such as an internal output stage. At least the signal pre-processing stage 101 and the post-processing stage 102 may be integrated in an integrated circuit device 103. The integrated circuit device 103 may receive the control input signal 100 and at least two feedback signals from, e.g., an analog feedback signal 104 from an external analog dv/dt monitoring stage 105 and a digital feedback signal 114 from an external analog-to-digital converter 112 which converts a voltage into binary words forming the digital feedback signal 114. The analog-to-digital converter 112 is connected upstream of an internal dv/dt monitoring stage 115 which is arranged in the integrated circuit device 103.

The feedback signal 104 (e.g., voltage and/or current) may be combined (e.g., summed up) in the integrated circuit device 103 with an internal control signal 111 (e.g., voltage and/or current) from the internal pre-processing stage 101 at an input of post-processing stage 102. The monitoring stage 105 performs an analog calculation of the voltage changes per time dv/dt from the voltage over the load path of semiconductor device 106, e.g., the voltage at the collector of semiconductor device 106. The monitoring stage 115 performs a digital calculation of the voltage changes per time dv/dt from the digital feedback signal 114 which represents the voltage over the load path of semiconductor device 106. The monitoring stage 115 controls the pre-processing stage 101 which outputs an analog signal 110 (e.g., voltage and/or current) dependent on the input signal 100 and the digital feedback signal 114.

Furthermore, the external dv/dt-monitoring stage 105 and the internal dv/dt-monitoring stage 115 evaluate the voltage changes per time of the voltage over the load path of the semiconductor device 106 to be controlled. Voltage evaluation may include at least one of monitoring a voltage change, gating the feed-back signal, detecting rise and fall of the voltage, amplifying or attenuating the at least one feedback signal etc. The output stage 102 provides a control output signal 116, e.g., a controlled voltage and/or current that depend(s) on the control input signal 100 and the feedback signals 104 and 114 to regulate voltage changes dv/dt at the control path (gate) semiconductor device 106.

Optionally, the integrated circuit device 103 may be connected to the gate of semiconductor device 106 via a resistor 109. Also optionally, the signal pre-processing stage 101 and the post-processing stage 102 may be connected via a resistor 110. The resistor 109 may have as little resistance as possible, just enough to damp oscillations in the control path (gate) of the semiconductor de-vice 106 and, thus, stabilize the whole circuit. The currents into the control path (gate) of the semiconductor device 106 are controlled indirectly through feed-back into the output stage that forms part of the signal post-processing stage 102 of the integrated circuit device 103 in the present example. The resistor 110 allows feedback currents (forming signal 104) to generate a voltage difference against the voltage provided by pre-processing stage 101, thus regulating the input of output stage of the signal post-processing stage 102 to provide a slope control for semiconductor device 106.

The signal pre-processing stage 101 may perform at least one of level shifting, galvanic isolation, and signal shape processing. The signal post-processing stage 102 is in the present example a voltage-to-voltage amplifier which supplies any current required to achieve the output voltage but may alternatively be a current-to-voltage amplifier as shown, current-to-current amplifier or voltage-to-current amplifier while the circuits upstream and downstream of the respective amplifier are adapted accordingly. The integrated circuit device 103 may be referenced to ground 108, which is one end of the parasitic inductance 107, e.g., the outer end of the parasitic inductance 107. As can be seen, the feedback signals 104 and 114 that represent the voltage change dv/dt act against resistor 110.

Figure 2:
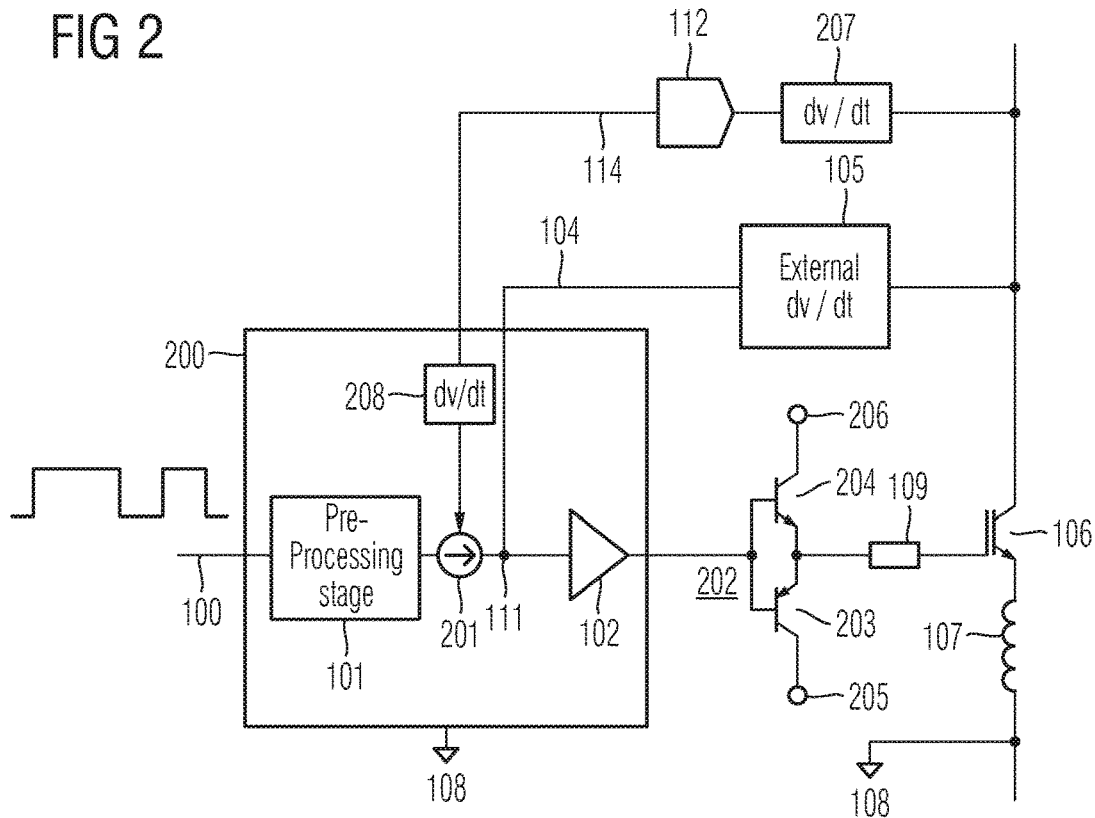
FIG. 2 is schematic diagram illustrating an exemplary driver circuit with an external output boost circuit and with an integrated circuit having analog and digital dv/dt feedback paths.

Referring to FIG. 2, the driver circuit shown in FIG. 1 may be modified in that instead of integrated circuit device 103 an integrated circuit device 200 is used in which resistor 110 is substituted by a digitally controllable current source 201. As can be seen, the feedback signal 104 (current) acts against current source 201 which provides ideally an infinite DC resistance. The current source 201 is controlled by a digital dv/dt-monitoring stage 208 which digitally evaluates the voltage changes per time of the voltage over the load path of the semiconductor device 106. An analog monitoring stage 207 performs an analog calculation of the voltage changes per time dv/dt from the voltage over the load path of semiconductor device 106. Digital-to-analog converter 112 connected between analog monitoring stage 207 and digital dv/dt-monitoring stage 208 converts the resulting analog dv/dt signal from analog monitoring stage 207 into a digital dv/dt signal for digital dv/dt-monitoring stage 208. The current source 201 may be further adjustable to provide specific currents for different semiconductor devices 106.

Furthermore, an external power amplifier 202 may be inserted between the post-processing stage 102 and the resistor 109. In the present example, the power amplifier 202 includes one amplifier stage formed by a complementary transistor pair (e.g., with pnp bipolar transistor 203 and npn bipolar transistor 204) connected in a complementary emitter follower structure between a negative voltage supply line 205 and a positive voltage supply line 206. For example, the post-processing stage 102 may have a current drive capability of up to 1 or 2 Amperes and the current amplifier 202 may increase the capability by a factor of 10 to 50 so that resistor 109 may be reduced in the circuit shown in FIG. 2. The post-processing stage 102 and/or the current amplifier 202 may alternatively have a class A or class A/B amplifier structure in order to increase the speed with which a hand-over from positive to negative currents is performed. Alternatively or additionally, post-processing stage 102 and/or the power amplifier 202 may have more than one amplifier stage to achieve a very low parasitic driver inductance. Digital monitoring stage 115 is substituted by a digital monitoring stage 208 that digitally processes digital input signals and provides digital output signals.

By providing access to the input of the internal output stage of the integrated circuit device the current provided by the feedback stages can be reduced further (to some 10 mA) due to the smaller parasitic capacitances and increased speed and flexibility an integrated circuit can provide. At the same time, it can reduce the number of cascaded external output stages that are needed. An output stage can commonly supply a maximum current of 0.5 A to 2 A or in some cases up to 6 A. Furthermore, the feedback path needs to feed less current so that a smaller feedback capacitor (small extra capacitances on a high voltage switching node) are required, making the whole circuit more efficient in terms of power consumption and size. Amplifying this current by one or more external stages may provide sufficient current to drive very large IGBT devices, power semiconductor modules etc. Alternative to driving the input of the internal power stage by way of a controllable voltage source and a resistor, it may be driven with a controllable current source that can supply positive and negative currents. This allows for a more linear (if the dv/dt feedback capacitance is linear) and load independent regulation of dv/dt (and/or di/dt).

Figure 3:
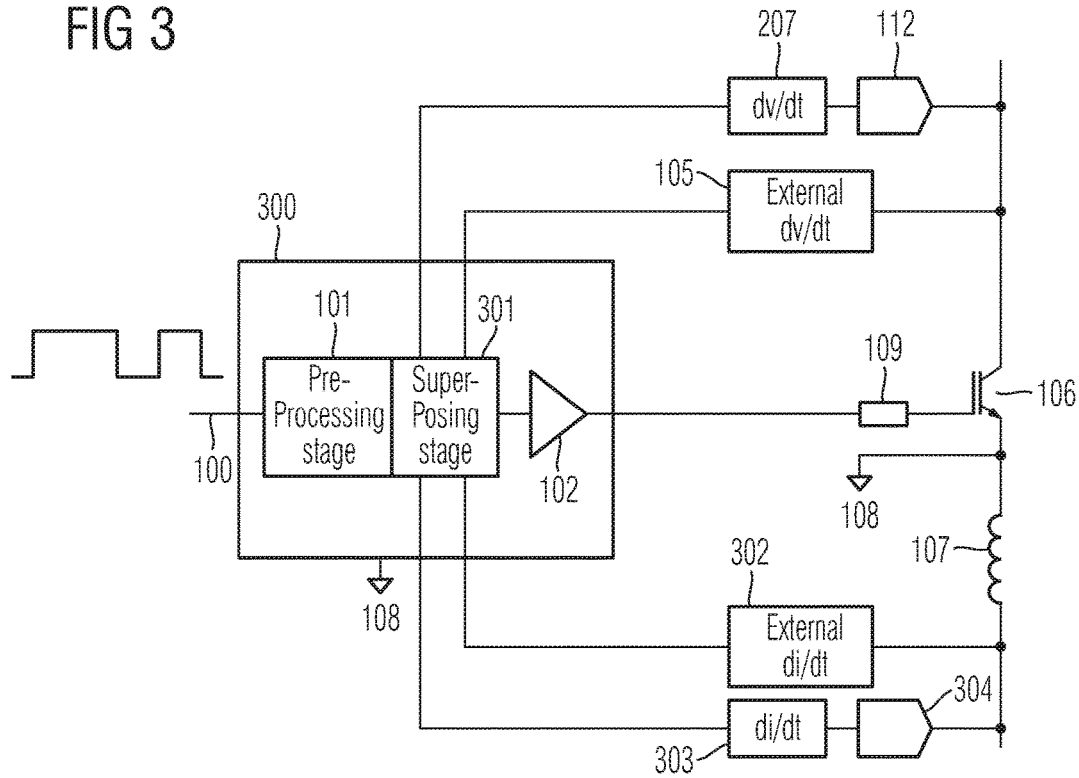
FIG. 3 is schematic diagram illustrating an exemplary driver circuit without an external output boost circuit and with an integrated circuit having analog and digital dv/dt and di/dt feedback paths.

As shown in FIG. 3, the driver circuit shown in FIG. 2 may be modified in that instead of integrated circuit device 200 an integrated circuit device 300 is used in which current source 201 is omitted and a feedback processing and superposing stage 301 is connected between the pre-processing stage 101 and the post-processing stage 102. The digital dv/dt monitoring stage 207 digitally processes digital input signals, e.g., a binary signal representative of the voltage over the load path of semiconductor device 106, and provides a digital output signal, e.g., a binary signal representative of the derivative of the voltage over the load path of semiconductor device 106. Furthermore, at least one other external feedback stage, e.g., an external analog di/dt monitoring stage 302 and/or an external digital di/dt monitoring stage 303, is connected via an analog-to-digital converter 304 to the load path of semiconductor device 106. The feedback processing and superposing stage 301 receives signals from the dv/dt-monitoring stages 105 and 207, signal pre-processing stage 101 and additionally from the analog di/dt monitoring stage 302 and the digital di/dt monitoring stage 303. The digital di/dt monitoring stage 303 digitally processes digital input signals, e.g., a binary signal representative of the current through the load path of semiconductor device 106, and provides a digital output signal, e.g., a binary signal representative of the derivative of the current through the load path of semiconductor device 106.

Figure 4:
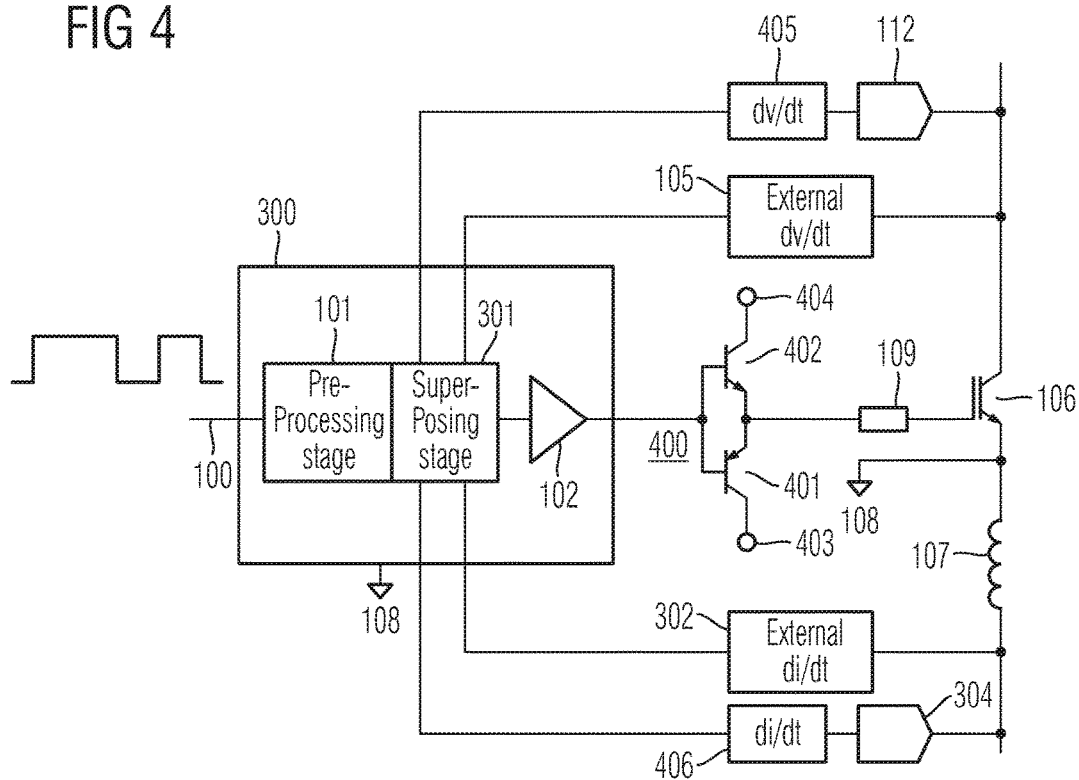
FIG. 4 is schematic diagram illustrating an exemplary driver circuit with an external output boost circuit and with an integrated circuit having analog and digital dv/dt and di/dt feedback paths.

The driver circuit shown in FIG. 3 may be modified as shown in FIG. 4 in that a power amplifier 400 is inserted between the post-processing stage 102 and the resistor 109. In the present example, the power amplifier 400 includes one amplifier stage formed by a complementary transistor pair (e.g., with a pnp bipolar transistor 401 and an npn bipolar transistor 402) connected in a complementary emitter follower structure between a negative voltage supply line 403 and a positive voltage supply line 404. Alternatively, the power amplifier 400 may have more than one amplifier stage to achieve a very low parasitic driver inductance and/or may have a class A or class A/B amplifier structure in order to increase the speed with which a hand-over from positive to negative currents is performed. Furthermore, digital dv/dt-monitoring stage 207 is substituted by a digital dv/dt-monitoring stage 405 and digital di/dt-monitoring stage 303 is substituted by a digital di/dt-monitoring stage 406. The dv/dt-monitoring stage 405 and the di/dt-monitoring stage 406 digitally process digital input signals and provide digital (binary) output signals.

Figure 5:
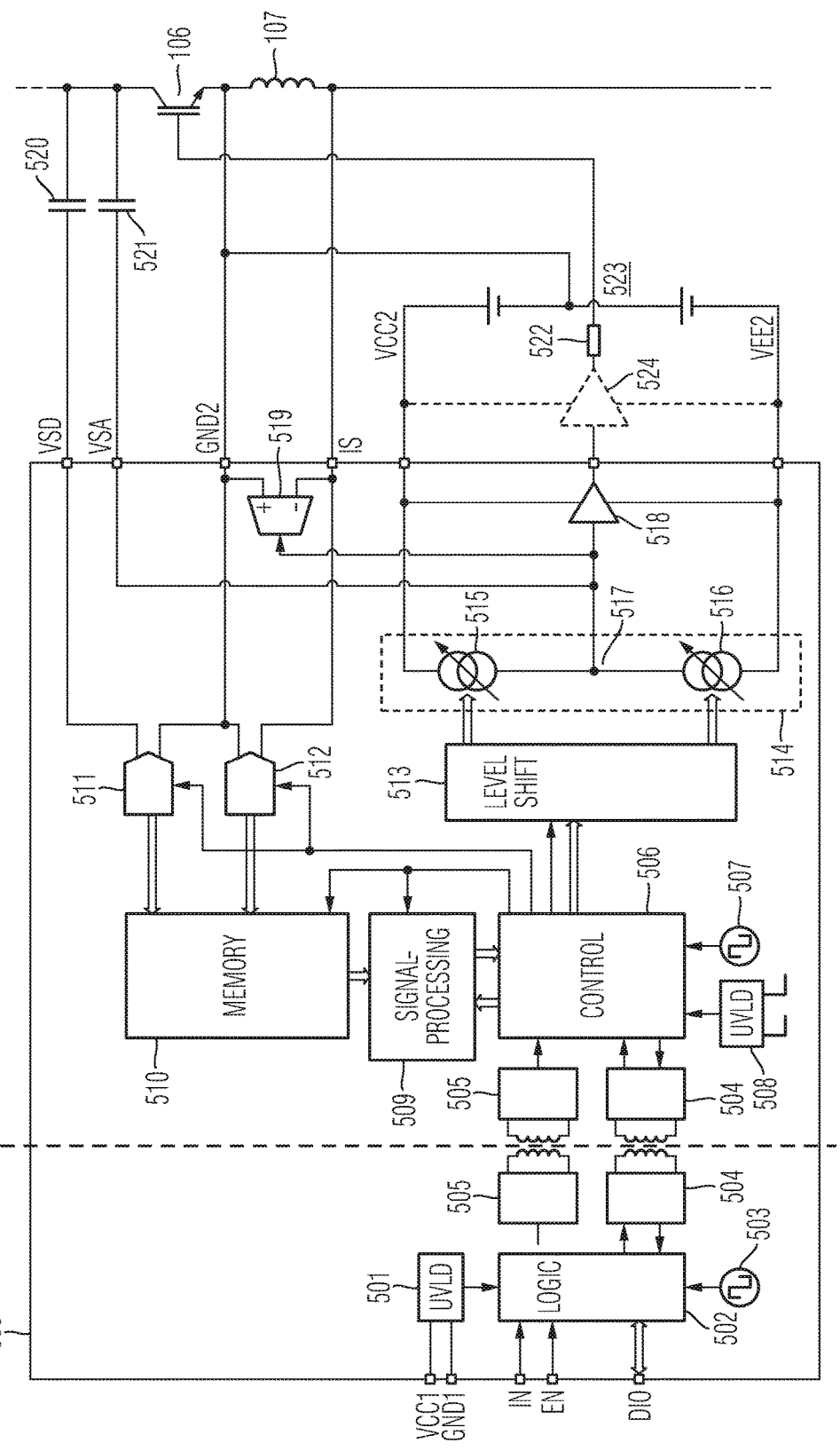
FIG. 5 is schematic diagram illustrating an exemplary driver circuit with analog and digital feedback paths.

Referring to FIG. 5, another exemplary driver circuit includes an integrated circuit device 500 which has low voltage circuitry part and a higher voltage circuitry part galvanically isolated from the low voltage circuitry part. The low volt-age circuitry part includes an under voltage lockout (UVLO) block 501 that receives a (positive) supply voltage VCC1 of the integrated circuit device 500 and first ground GND1 to which the integrated circuit device 500 is referred to. The under voltage lockout block 501 is an electronic circuit block used to disable and/or turn off the power for the integrated circuit device 500 in the event of the supply voltage VCC1 dropping below an operational value. For example, in the integrated circuit device 500, the under voltage lockout block 501 may monitor the supply voltage VCC1 and turn off the circuit if the supply voltage VCC1 drops below a specific threshold, thus protecting the integrated circuit device 500 and, as the case may be, also a semiconductor device and/or a load associated with the integrated circuit device 500. The low voltage circuitry part of the integrated circuit device 500 may further include a logic block 502 which receives an input (control) signal IN, e.g., for switch control, and an enable signal EN, e.g., for enabling or disabling, e.g., the logic block 502, the integrated circuit device 500 or the whole driver circuit.

The logic block 502 may also provide a digital input/output interface for ex-changing digital data DIO such as specific control data, status data, service data etc. with other units (not shown). Furthermore, the logic block 502 may be clocked with a clock signal provided by a clock signal generator 503 and may be connected to a galvanically isolating bidirectional signal coupler 504, which may provide the isolation on an inductive (as shown), capacitive, optical or any other appropriate basis. Optionally, another signal coupler 505, e.g., a unidirectional coupler, may couple in terms of signals but galvanically isolate the low voltage circuitry part and the higher voltage circuitry part.

In the higher voltage circuitry part, the signal coupler 504 and, if present, the signal coupler 505 are connected to a control block 506, which may be a logic block or a software block in a processor implementation or a combination of both. The control block 506 receives a clock signal from a clock signal generator 507 and a signal from an under voltage lockout block 508 for the higher voltage circuitry part. The control block 506 exchanges digital data with a central signal processing block 509 which may provide for load path voltage/current slope post processing, regulation and adaptation. For example, the central signal processing block 509 may be adapted or programmed to realize a digital loop controller comprising a least one of a proportional control mechanism (P), integral control mechanism (I), derivative control mechanism (D) or combinations thereof such as, e.g., a PI or PID control mechanism. Furthermore, the control block 506 sends an on/off signal to the central signal processing block 509 and a memory 510, a sampling control signal to two analog-to-digital conversion blocks 511 and 512, and another on/off signal as well as slope shape data to a level shifting block 513. The analog-to-digital conversion blocks 511 and 512 send data to the memory 510. Analog-to-digital conversion block 511 receives a voltage sense signal VSD (e.g., a voltage or current) referred to a second ground GND2 and analog-to-digital conversion block 512 receives a current sense signal IS (e.g., a voltage or current) referred to a second ground GND2.

The level shifting block 513 sends control data to an adaptive driver block 514, which may include two digitally controllable current sources 515 and 516 connected in series between a (negative) supply voltage VEE2 and a (positive) supply voltage VCC2 with a node 517 between the two current sources 515 and 516. At least one of the supply voltages VEE2 and VCC2 may be monitored by the under voltage lockout block 508. The current sources 515 and 516 are each controlled by digital data provided by the level shifting block 513. A driver output stage 518 is connected to the node 517, to a line that carries a voltage sense signal (e.g., a voltage or current) and to the output of a transconductance amplifier block 519 whose non-inverting input is connected to the second ground GND2 and whose inverting input is connected to a line that receives a current sense signal IS (e.g., a voltage over an inductance corresponding to a change in current to be measured).

The external wiring of the integrated circuit device 500 includes two capacitors 520 and 521 which couple the collector line of semiconductor device 106 with the line carrying the voltage sense signal VSD and the line carrying the voltage sense signal VSA, respectively. The two capacitors 520 and 521 are used to obtain dv/dt from the voltage over the load path. The second ground GND2 is established by a node between the emitter of semiconductor device 106 and one end of the parasitic inductance 107. The current sense signal IS is picked up at the other end of the parasitic inductance 107. The inductance 107 is used to differentiate the current through the load path to obtain di/dt and to transform the current into a corresponding voltage to be measured. The gate of semiconductor device 106 is connected via a resistor 522 to the output stage 518. The supply voltages VEE2 and VCC2 may be provided by a bipolar voltage source 523 whose ground is connected to the second ground GND2. Optionally, a power amplifier 524, which may also be supplied with supply voltages VEE2 and VCC2, is connected between the output stage 518 and the resistor 522. In the exemplary driver circuit shown in FIG. 5, blocks 501-509, 513 may form a pre-processing stage, blocks 510-512, 519 a feedback processing and superposing stage, and blocks 515-518 a signal post-processing stage.

By adding external feedback capacitance (e.g., capacitors 520 and 521) and providing a power stage (e.g., output stage 518) that buffers the current source driver (e.g., driver block 514), dv/dt feedback and/or di/dt feedback require a much lower peak current on the current source driver. In this way, the current source driver can be designed with lower power elements allowing the current source to be more accurate and faster in changing its current value. Additionally, the current source driver can be built as current-output digital-to-analog converter that can be programmed digitally in order to change dv/dt and/or di/dt. An additional outer digital cycle regulation loop may be added to further control the dv/dt and/or di/dt as shown in FIG. 5. The programming of dv/dt and di/dt can be changed independently without changing the dv/dt or di/dt analog feedback networks. The digital loop may track changes of the load path voltage and load path current in order to change the digital-to-analog converter output current at the correct time when a hand-over occurs between dv/dt and di/dt. In general, the analog feedback path is faster (smaller delay times caused by signal processing and/or a higher critical frequency) but offers a lower accuracy and flexibility. In contrast, the digital feedback path is slower (greater delay times caused by signal processing and/or a lower critical frequency) but offers higher accuracy and flexibility.

The driver circuit shown in FIG. 5 is an example of how an integrated driver with high voltage level-shifting as well as analog and digital dv/dt and di/dt feed-back paths may be implemented. The di/dt feedback path (e.g., corresponding to signal IS) senses the voltage at the emitter inductance (e.g., parasitic inductance 107), injecting/sinking a corresponding (e.g., proportional) current into/from a summing node (e.g., node 517) of a reference current originating from a current source pre-driver stage (e.g., transconductance amplifier block 519) and the dv/dt analog-feedback capacitor (e.g., capacitor 521). The summing node controls the input of a unity gain amplifier (one internal stage such as output stage 518 only or in combination with an external cascaded stage such as current amplifier 524) that, in turn, drives the gate voltage of the external semi-conductor device (e.g., semiconductor device 106). The dv/dt digital-feedback path may be implemented by way of an analog-to-digital converter (e.g., analog-to-digital converter block 511) that samples the current flowing through the dv/dt digital-feedback capacitor (e.g., capacitor 520). The di/dt digital-feedback path is implemented by way of an analog-to-digital converter (e.g., analog-to-digital converter block 512) that samples a voltage change over the emitter inductance (e.g., parasitic inductance 107) representative of a current change through the emitter inductance.

Figure 6:
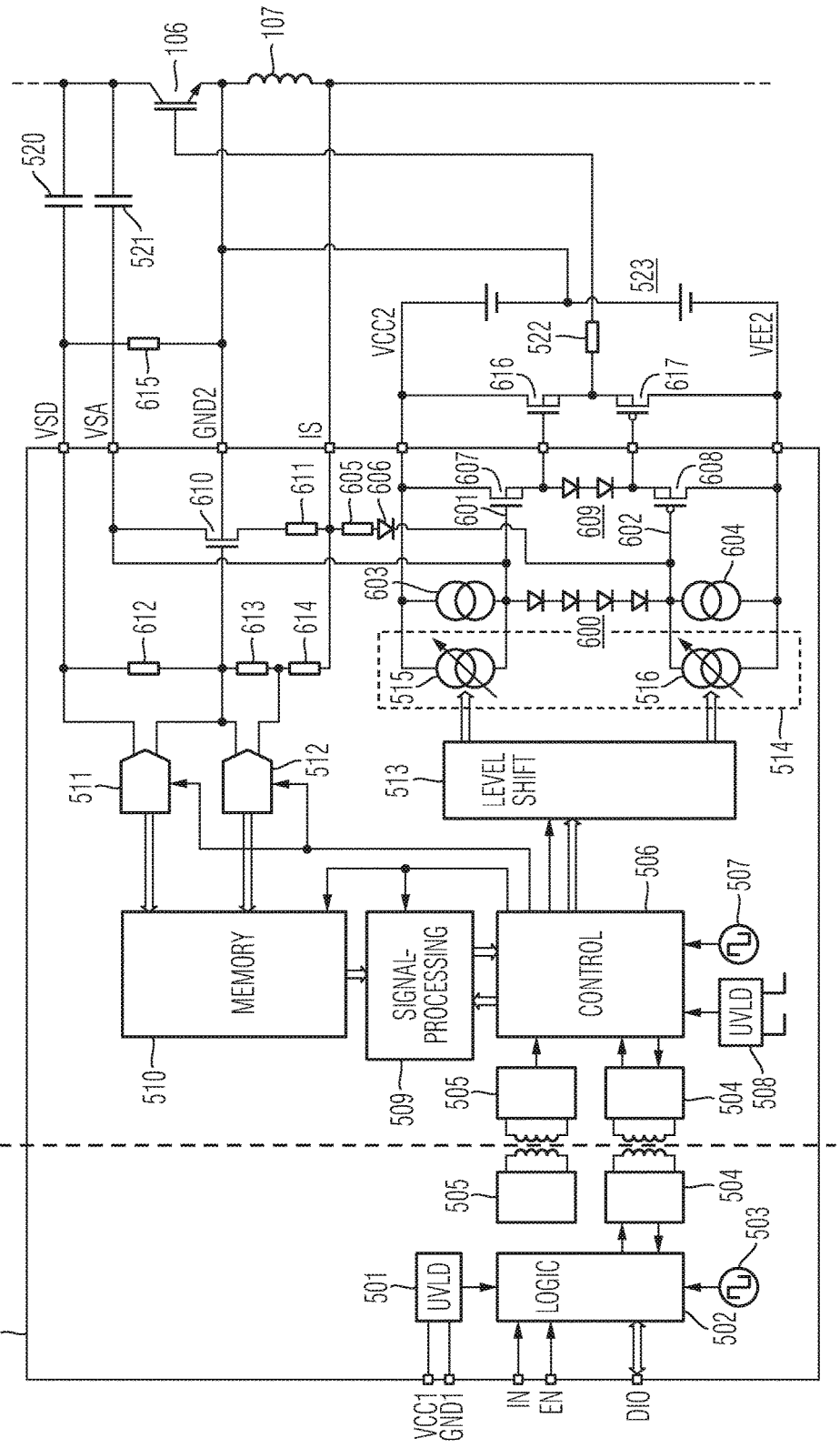
FIG. 6 is schematic diagram illustrating an exemplary driver circuit with modified analog and digital feedback paths.

FIG. 6 shows the driver circuit described above in connection with FIG. 5 with some modifications and alternative implementations. The two digitally controllable current sources 515 and 516 are connected with each other through a diode series connection 600 of one or more diodes (e.g., four diodes), thereby forming a node 601 between current source 515 and one end of diode series connection 600, and a node 602 between current source 516 and the other end of diode series connection 600. Each digitally controllable current source 515, 516 is connected in parallel with a constant current source 603 and 604, respectively. The line carrying the voltage sense signal VSA is connected to node 601 and the line carrying the current sense signal IS is connected through a resistor 605 and a diode 606 (instead of transconductance amplifier block 519) to node 602.

The output stage 518 shown in FIG. 5 is substituted by a class A/B amplifier stage including a metal-oxide-semiconductor field-effect transistor (MOSFET) 607 of the n-channel type whose gate is connected to the node 601 and whose drain is connected to the supply voltage VCC2, and including a metal-oxide-semiconductor field-effect transistor 608 of the p-channel type whose gate is connected to the node 602 and whose drain is connected to the supply voltage VEE2. The sources of transistors 607 and 608 are connected with each other via another diode series connection 609 with at least one diode (e.g., two diodes). Furthermore, a metal-oxide-semiconductor field-effect transistor 610 of the n-channel type is connected via its gate to second ground GND2 and via its drain to the line carrying the voltage sense signal VSA. The source of transistor 610 is connected through a linearization resistor 611 to the line carrying the current sense signal IS. Furthermore, a resistor 612 may be connected between the line carrying the voltage sense signal VSD and the second ground GND2, and a voltage divider including two resistors 613 and 614 connected in series is connected between the second ground GND2 and the line carrying the current sense signal IS to reduce the voltage swing at the respective analog-to-digital converter input if required.

The input of analog-to-digital converter block 512 is now connected to a node between resistors 613 and 614 (instead of being connected directly to the line carrying the current sense signal IS). Optionally, an external resistor 615 may be connected in parallel to resistor 612. The current amplifier 524 may be realized in the present example by way of a metal-oxide-semiconductor field-effect transistor (MOSFET) 616 of the n-channel type whose gate is connected to the source of transistor 607 and whose drain is connected to the supply voltage VCC2, and by way of a metal-oxide-semiconductor field-effect transistor 617 of the p-channel type whose gate is connected to the source of transistor 608 and whose drain is connected to the supply voltage VEE2. The sources of transistors 607 and 608 are connected with each other and resistor 522.

In the driver circuit of FIG. 6, the unity gain buffer stage (output stage 518 in FIG. 5) is replaced by two cascaded Class-A/B amplifier stages (transistors 607, 608, 616, 617 and diode series connection 609 in FIG. 6) and two bias current sources (constant current sources 603 and 604 in FIG. 6). The analog dv/dt feedback path stays the same. The analog di/dt feedback path is replaced by two separate feedback paths for turn-on (transistor 610 and resistor 611) and turn-off (resistor 605 and diode 606 in FIG. 6).

Figure 7:
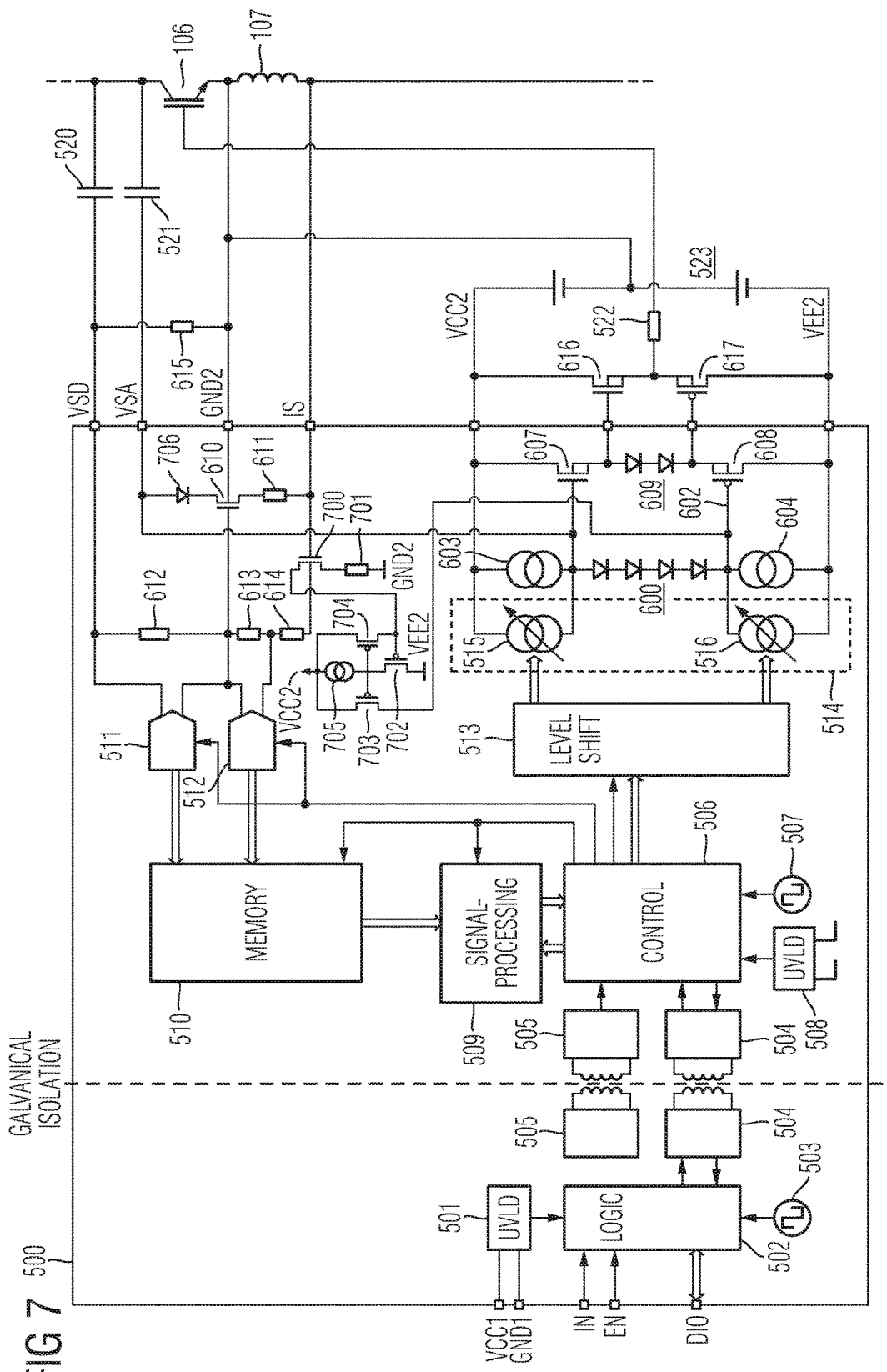
FIG. 7 is schematic diagram illustrating an exemplary drive circuit with still further modified analog and digital feedback paths.

In the driver circuit discussed above in connection with FIG. 6, resistor 605 and diode 606 may be substituted by a metal-oxide-semiconductor field-effect transistor 700 of the n-channel type, a resistor 701, metal-oxide-semiconductor field-effect transistors 702-704 of the p-channel type and a current source 705. As shown in FIG. 7, transistor 700 may be connected via its gate to the line carrying the current sense signal IS and via its source and through the linearizing resistor 701 to the second ground GND2 providing a voltage-to-current con-version. The transistor 702 is connected via its drain to the supply voltage line VEE2, via its gate to the drains of transistors 700 and 704, and via its source to the gates of transistors 703 and 704. A current source 705 is connected be-tween the supply voltage line VCC2 and the gates of transistors 703 and 704. The sources of transistors 703 and 704 are also connected to the supply voltage line VCC2. The drain of transistor 703 is connected to the node 602. Transistors 702-704 in connection with current source 705 form a current mirror circuit which reverses the turn-off di/dt feedback current from transistor 700. The speed of the current mirror with transistors 703 and 704 is boosted by the addition of transistor 702 which acts as a source follower. In order to speed up the current mirror in both directions, current source 705 has been added. Furthermore, a diode 706 is inserted between the line carrying the voltage sense signal VSA and the drain of transistor 610.

The driver circuit shown in FIG. 7 allows also for operations when the ground GND2 and the supply voltage VEE2 are not the same so that also bipolar power supplies can be employed to supply the gate driver. Furthermore, the turn-off di/dt feedback does not directly feed a current into the summing node through a resistor that makes the feedback load dependent e.g., on the load condition of the semiconductor device 106 and/or its Miller plateau. For example, if the voltage change dv/dt is fed back directly from the collector of the semiconductor device 106 through a capacitor (capacitor 520) to the summing node, the feedback current through the feedback capacitor (capacitor 520) would be dependent on the voltage change dv/dt at the collector of the semiconductor device 106 when the gate voltage of the semiconductor device 106 is at the Miller plateau. However, the current change di/dt, if it is directly fed back through a resistor (e.g., resistor 605 in FIG. 6), would become dependent on the voltage difference between the di/dt induced voltage of the inductance (parasitic inductance 107) and the actual voltage level of the gate of the semiconductor device 106 (or input of a buffer stage).

In the driver circuit shown in FIG. 7, the semiconductor device 106 is driven with a bipolar power supply and a load independent di/dt feedback. For turn-on di/dt, a simple diode (diode 706) is set at reversed bias when the summing node (including gate of transistor 607) is pulled below second ground GND2. The transistor 610 connected as a source follower over resistor 611 automatically creates a handover from positive to negative current regulation. The current summing node (including gate of transistor 607), with dV/dt through capacitor 521 and di/dt over inductance 107, automatically hands over from dV/dt to di/dt regulation. To make the feedback at turn-off independent from the load, the transconductance amplifier may be configured to measure the voltage differentially over the parasitic inductance 107 and then to inject a high side current into the summing node 602 that is independent from the summing node voltage. A similar concept as for the turn-on voltage change di/dt feedback may be implemented to generate a current proportional to the voltage across parasitic inductance 107 when semiconductor device 106 turns off. However, this current has the wrong polarity. In order to obtain the correct polarity of the current, a high side current mirror is employed (transistors 703 and 704). Transistor 702 and the current source 705 are used to achieve the necessary bandwidth in the current mirror. The approaches outlined above can also be implemented with discrete devices but control of speed and control of parasitic elements may be more favorable when realized in an integrated circuit.

In the examples described above in connection with FIGS. 1-7, the analog feedback stages and digital feedback stages comprise signal delay times due to their respective signal processing. The signal delay time of the digital feedback stages may be greater than the delay time of the corresponding analog feedback stages. However, the accuracy of the digital feedback stages may be greater than that of the corresponding analog feedback stages. Furthermore, digital feedback stages or paths may not only include digital circuitry but also analog and digital (mixed) circuitry.

An embodiment of the invention combines the circuits discussed above for regulating the di/dt and the dv/dt of a power switch when it is turned on and off, together with the circuits using the regulated di/dt to detect an overcurrent at turn-on (SC1) and circuits using the regulated dv/dt to detect an overvoltage at turn-off. A time measurement can be used to determine current and voltage levels since the values of di/dt and the dv/dt are regulated and known. The time measurements associated with the power switch are discussed below with references to FIGS. 8-11.

Figure 8:
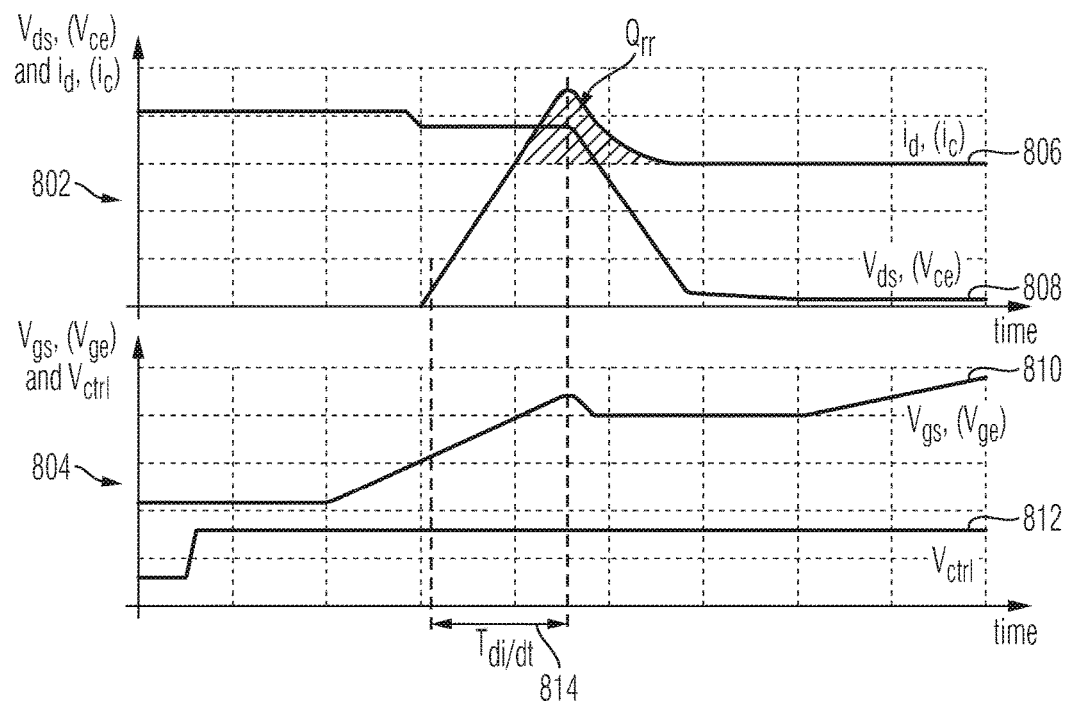
FIG. 8 is a timing diagram showing turn-on waveforms associated with a power switch.

FIG. 8 is a timing diagram showing turn-on waveforms associated with a di/dt and dv/dt regulated power switch. A first timing diagram portion 802 shows drain or collector regulated current waveform 806, which also shows an overshoot in current which may be caused by a reverse recovery charge Qrr of a diode or the charging of a capacitance. Timing diagram portion 802 also shows drain-to-source or collector-to-emitter regulated voltage waveform 808. The time that the switch is in current regulation up to a peak current value is shown by the $T_{di/dt}$ time interval 814. A second timing diagram portion 804 shows the gate-to-source or gate-to-emitter voltage 810 and a corresponding control signal 812 associated with the turn-on event.

Figure 9:
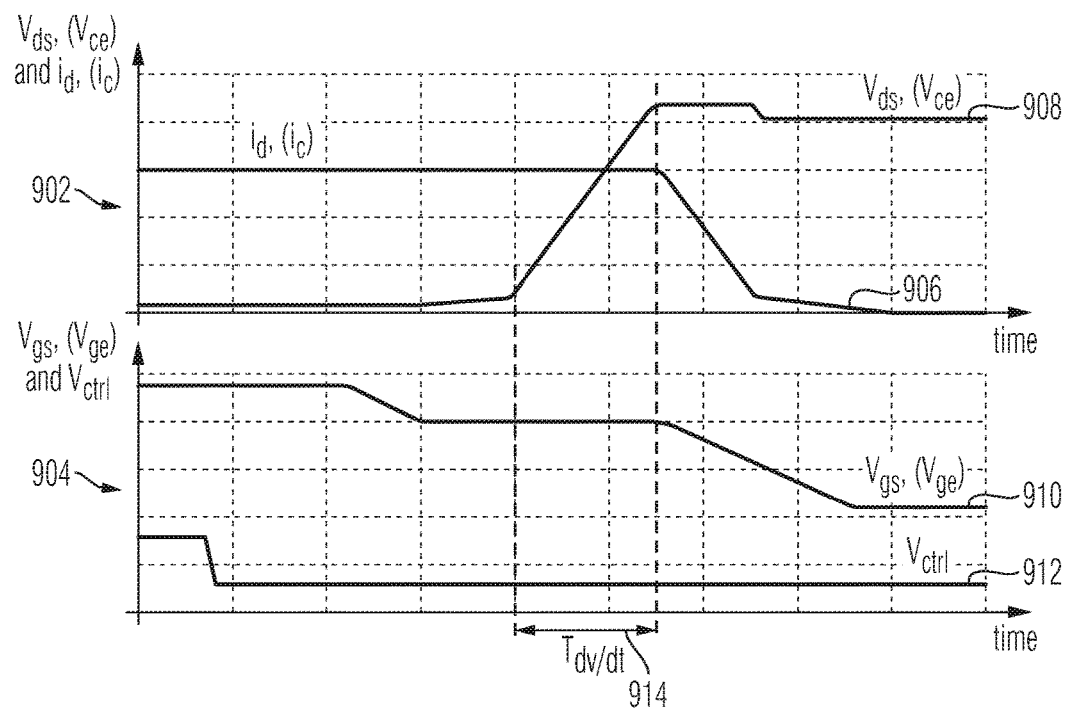
FIG. 9 is a timing diagram showing turn-off waveforms associated with a power switch.

FIG. 9 is a timing diagram showing turn-off waveforms associated with a di/dt and dv/dt regulated power switch. A first timing diagram portion 902 shows drain or collector regulated current waveform 906. Timing diagram portion 902 also shows drain-to-source or collector-to-emitter regulated voltage waveform 908. The time that the switch is in voltage regulation is shown by the $T_{dv/dt}$ time interval 914. A second timing diagram portion 904 shows the gate-to-source or gate-to-emitter voltage 910 and a corresponding control signal 912 associated with the turn-off event.

For a known di/dt the time for which the targeted di/dt is in regulation is a measure of the peak current at turn-on.

$$I_{peak} = \frac{di}{dt} T_{di/dt} \qquad \text{Eq. 1}$$

Therefore if $T_{di/dt} > T_{di/dt,limit}$ the switch can be turned off in order to protect it from an over current condition, which will be discussed in further detail below according to an embodiment of the invention.

FIG. 10 is a timing diagram showing over current protection waveforms at turn-on according to an embodiment method. A first timing diagram portion 1002 shows drain or collector regulated current waveforms 1006A (high current), 1006B (medium current), and 1006C (low current). Timing diagram portion 1002 also shows drain-to-source or collector-to-emitter regulated voltage waveforms 1008A (high current), 1008B (medium current), and 1008C (low current). The time that the switch is in current regulation up to a peak current value is shown by the $T_{di/dt}$ time interval 1014. For the high current case, the $T_{di/dt}$ time interval exceeds the $T_{di/dt,limit}$ time interval, which is followed by a switch turn-off as a consequence. A second timing diagram portion 1004 shows the gate-to-source or gate-to-emitter voltage waveforms 1010A (high current), 1010B (medium current), and 1010C (low current), as well as a corresponding control signal 1012 associated with the turn-on event.

For a known dv/dt the time for which the targeted dv/dt is in regulation is a measure of the voltage across the switch at turn-off.

$$V_{DC-link} = \frac{dv}{dt} T_{dv/dt} \qquad \text{Eq. 2}$$

Therefore if $T_{dv/dt} > T_{dv/dt,limit}$ the power switch can be turned-off with an even lower di/dt in order to limit the amount of negative di/dt induced overvoltage, which will be discussed in further detail below according to an embodiment of the invention.

FIG. 11 is a timing diagram showing over voltage protection waveforms at turn-off according to an embodiment method. A first timing diagram portion 1102 shows drain or collector regulated current waveforms 1106A (high voltage) and 1106B (medium and low voltage). Timing diagram portion 1102 also shows drain-to-source or collector-to-emitter regulated voltage waveforms 1108A (high voltage), 1108B (medium voltage), and 1108C (low voltage). The time that the switch is in voltage regulation is shown by the $T_{dv/dt}$ time interval 1114. For the high voltage case, the $T_{dv/dt}$ time interval exceeds the $T_{dv/dt,limit}$ time interval, which is followed by a change in the regulated di/dt value as a consequence. A second timing diagram portion 1104 shows the gate-to-source or gate-to-emitter voltage waveforms 1110A (high voltage), 1110B (medium voltage), and 1110C (low voltage), as well as a corresponding control signal 1112 associated with the turn-off event.

An advantage of circuit embodiments of the invention is the rapid speed of detection so that the power switch is not damaged during short circuit or overload conditions. It is a further advantage of circuit embodiments of the invention that substantially the same hardware used for regulating di/dt and dv/dt as previously discussed can be reused to detect short circuit (SC1) and overload conditions (SC2).

Figure 12:
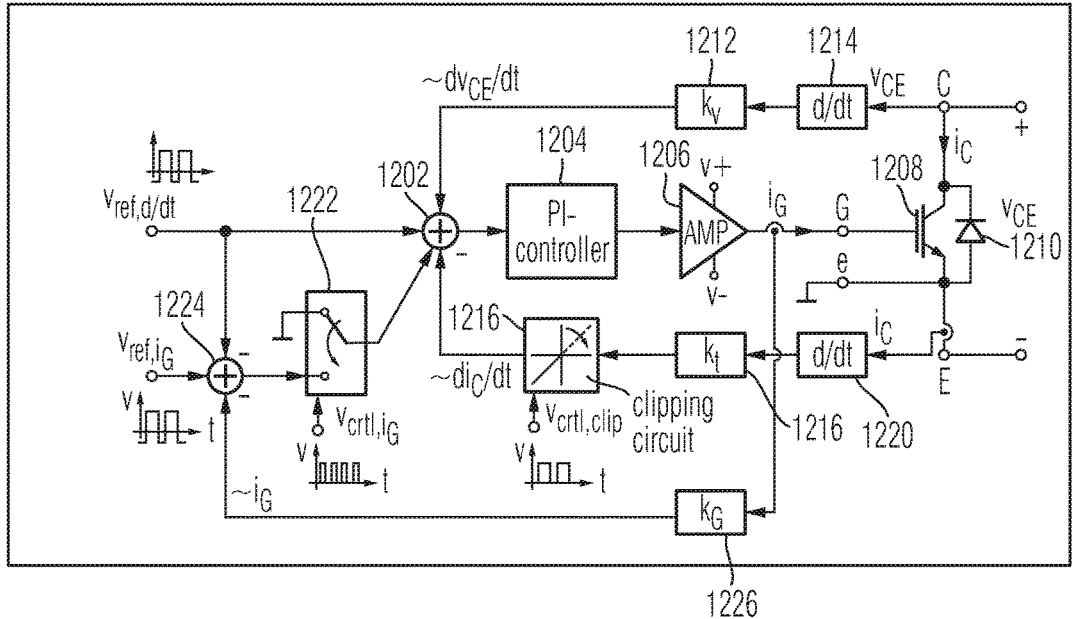
FIG. 12 is a block diagram of a power switch gate driver circuit including dv/dt and di/dt regulation.

FIG. 12 is a block diagram 1200 that summarizes a power switch gate driver circuit including dv/dt and di/dt regulation according to embodiments of the invention. Block diagram 1200 includes a power switch 1208 and antiparallel freewheeling diode 1210. A differentiator circuit 1214 is coupled to the collector node "C" for receiving the collector voltage and multiplied by a constant factor 1212. Similarly, a differentiator circuit 1220 is coupled to the emitter node "E" and multiplied by a constant factor 1218, and passed through an optional clipping circuit 1216. The output of differentiator circuit 1212 and the clipping circuit 1216 are summed in summer 1202, which also receives reference voltage $v_{ref,d/dt}$. The output of summer 1202 is coupled to a Proportional (P, PI, or PID) controller 1204, which in turn is coupled to preamplifier 1206. Preamplifier 1206 drives the gate node "G" of power switch 1208. Block diagram 1200 shows a circuit with combined closed-loop current slope and voltage slope control, which can be extended to include an additional gate current control including switch 1222, summer 1224, and constant factor 1226. Signal $v_{ref,d/dt}$ is the reference value for the current and voltage slope control, $v_{ctrl,clip}$ is the control command for the clipping circuit, $v_{ref,iG}$ is the reference value for the gate current control, and $v_{ctrl,iG}$ is the control command for the gate current control. The clipping circuit is used to remove negative di/dt values during dv/dt regulation. The optional gate current control circuitry is used to regulate the gate current during the turn-on and turn-off delay phases when the di/dt and dv/dt is zero. This will help to preset or prevent windup of the integral part of controller 1204.

Figure 13:
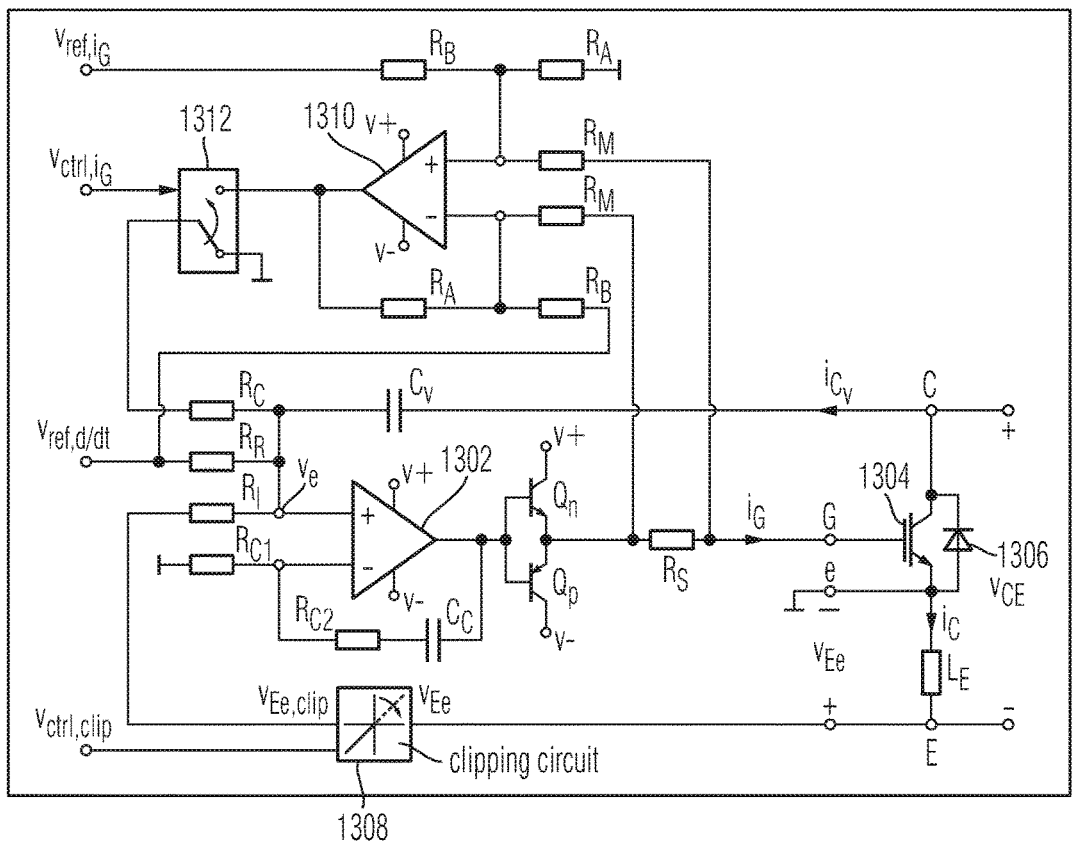
FIG. 13 is a schematic diagram of an implementation of the regulation circuit.

FIG. 13 is a schematic diagram of an implementation of the regulation circuit shown in block diagram form in FIG. 12. Circuit schematic diagram 1300 provides closed-loop regulation for di/dt and dv/dt for power switch 1304 and antiparallel free-wheeling diode 1306 using operational amplifier 1302, an additional amplifier with amplification $k_I$ with an optional clipping circuit 1308, and associated feedback resistors to provide the regulation functions as previously discussed. Clipping circuit 1308 is used to block negative di/dt feedback at turn-on. Operational amplifier 1310, switch 1312, and associated feedback resistors provide the optional gate current control as discussed above.

Figure 14:
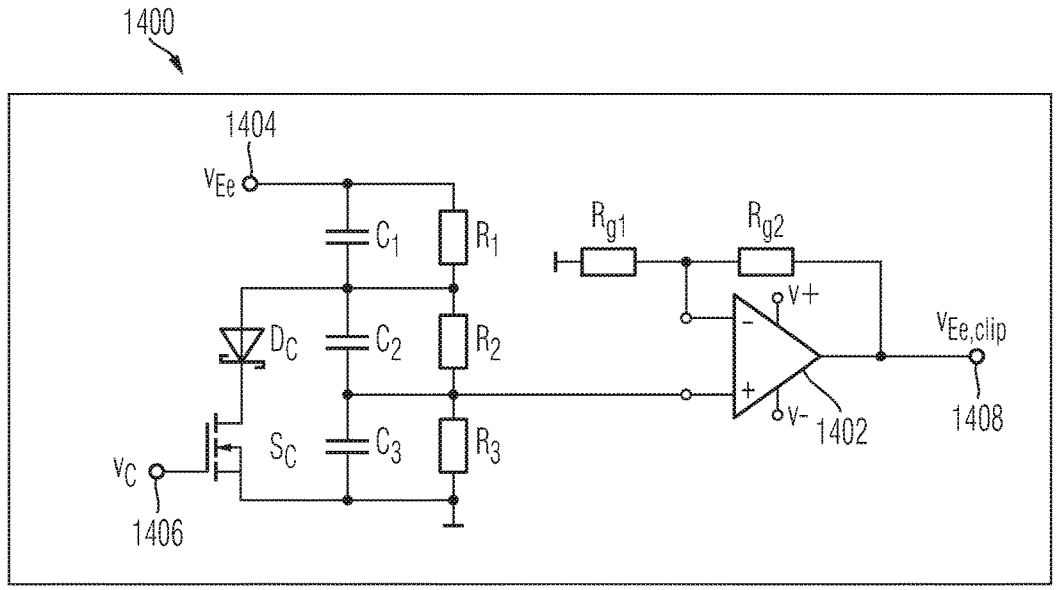
FIG. 14 is a schematic diagram of the implemented clipping circuit associated with the circuit of FIG. 13.

FIG. 14 is a schematic diagram of the implemented constant factor $k_I$ and clipping circuit 1400 associated with the circuit of FIG. 13, which receives the emitter voltage 1404 and control voltage 1406, to provide a clipped voltage at node 1408. Clipping circuit 1400 includes MOS transistor Sc, Zener diode Dc, capacitors C1, C2, and C3, as well as resistors R1, R2, and R3. The voltage at the junction between resistors R2 and R3 is sensed by operational amplifier 1402 including feedback resistors Rg1 and Rg2 to provide the clipped voltage at node 1408.

Figure 15:
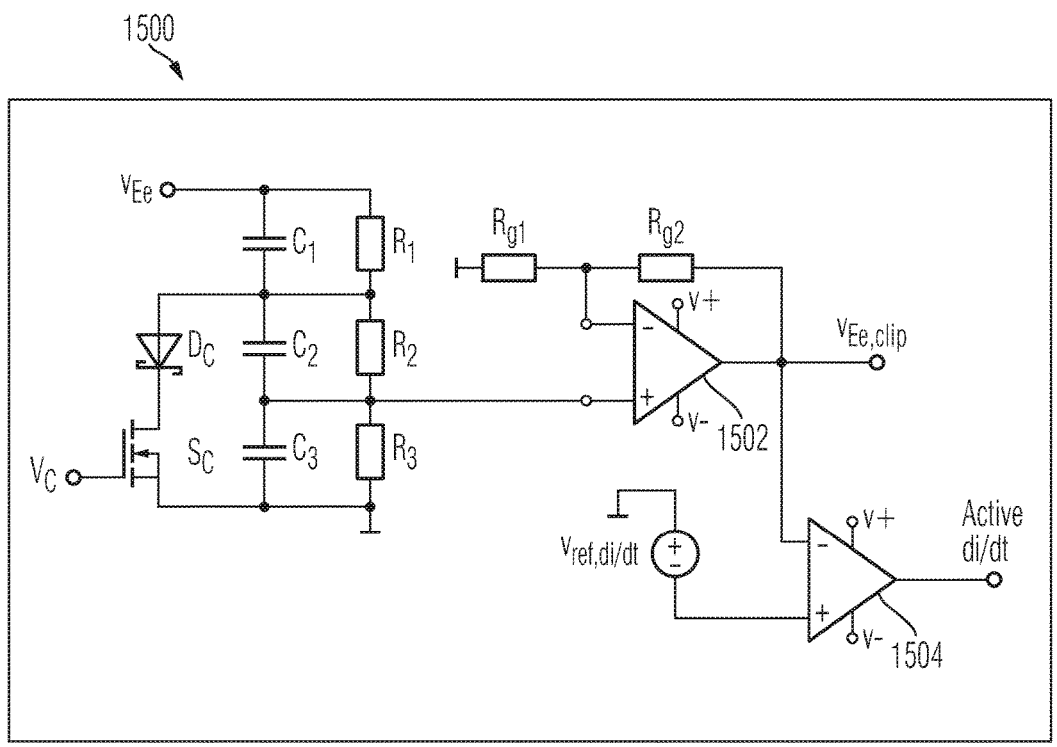
FIG. 15 is a schematic diagram of an active di/dt regulation detector according to an embodiment of the invention.

FIG. 15 is a schematic diagram of an active di/dt regulation detector 1500 according to an embodiment of the invention. The circuit of FIG. 14 is reproduced and operational amplifier 1402 corresponds to operational amplifier 1502 in FIG. 15. By adding a comparator 1504 and time measurement circuits discussed below, the di/dt and dv/dt regulation implementation according to embodiments of the invention can be complemented with over current protection.

A comparator 1504 placed after the di/dt attenuator and buffer circuit 1502 can detect when di/dt is above or below a certain value given by the $V_{ref,di/dt}$ voltage. In FIG. 15 the reference is given as a negative value and when the voltage $V_{Ee,clip}$ is above that value the di/dt is not at the turn-on targeted di/dt or not sufficiently above the targeted value and the output of the comparator is low. When the $V_{Ee,clip}$ voltage goes below $V_{ref,di/dt}$ the comparator 1504 output goes high as an indication that the di/dt regulation loop is in regulation. If the active di/dt signal stays high longer than a predefined value an overcurrent event has happened. And, in an embodiment of the invention, the gate driver can start a turn-off of the driven power switch. Since di/dt is regulated $V_{Ee,clip}$ will have a DC voltage value during the regulation.

While representations of di/dt and dv/dt closed loop regulation circuits are shown, and nodes associated with di/dt and dv/dt regulation have been identified, other such regulation circuits are possible, and various nodes within such circuits will be suitable candidates for use with the short circuit and overload protection features embodiments of the invention as is discussed in further detail below.

Figure 16:
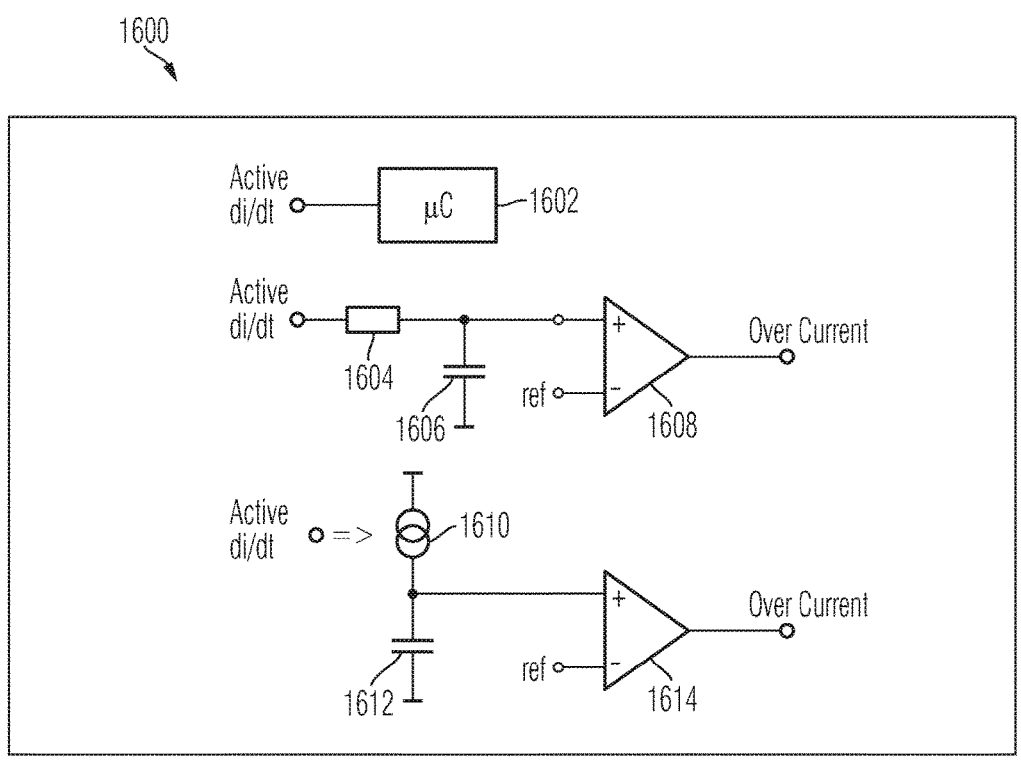
FIG. 16 shows examples of time measurement circuits for generating an over current signal according to an embodiment of the invention.

FIG. 16 shows examples of time measurement circuits 1600 for generating an over current signal according to an embodiment of the invention, having the active di/dt indication as an input, and an "over current" indication as an output. A first timing circuit comprises a microcontroller 1602 that can digitally count the length of time of the active di/dt signal measured between a rising edge and falling edge thereof. Although a microcontroller 1602 is shown, other digital/logic circuits (i.e. time to digital converter TDC) can be used. A second timing circuit comprises a resistor and capacitor 1606 coupled to the positive input of a comparator 1608. The negative input of the comparator 1608 is coupled to a reference voltage. If the active di/dt signal remains active for a sufficient time interval, comparator 1608 will provide the over current signal. Similarly, a third timing circuit includes a current source 1610 that is controlled by the active di/dt signal and is used to charge capacitor 1612. If the active di/dt signal remains active for a sufficient time interval, comparator 1614 will provide the over current signal.

Figure 17:
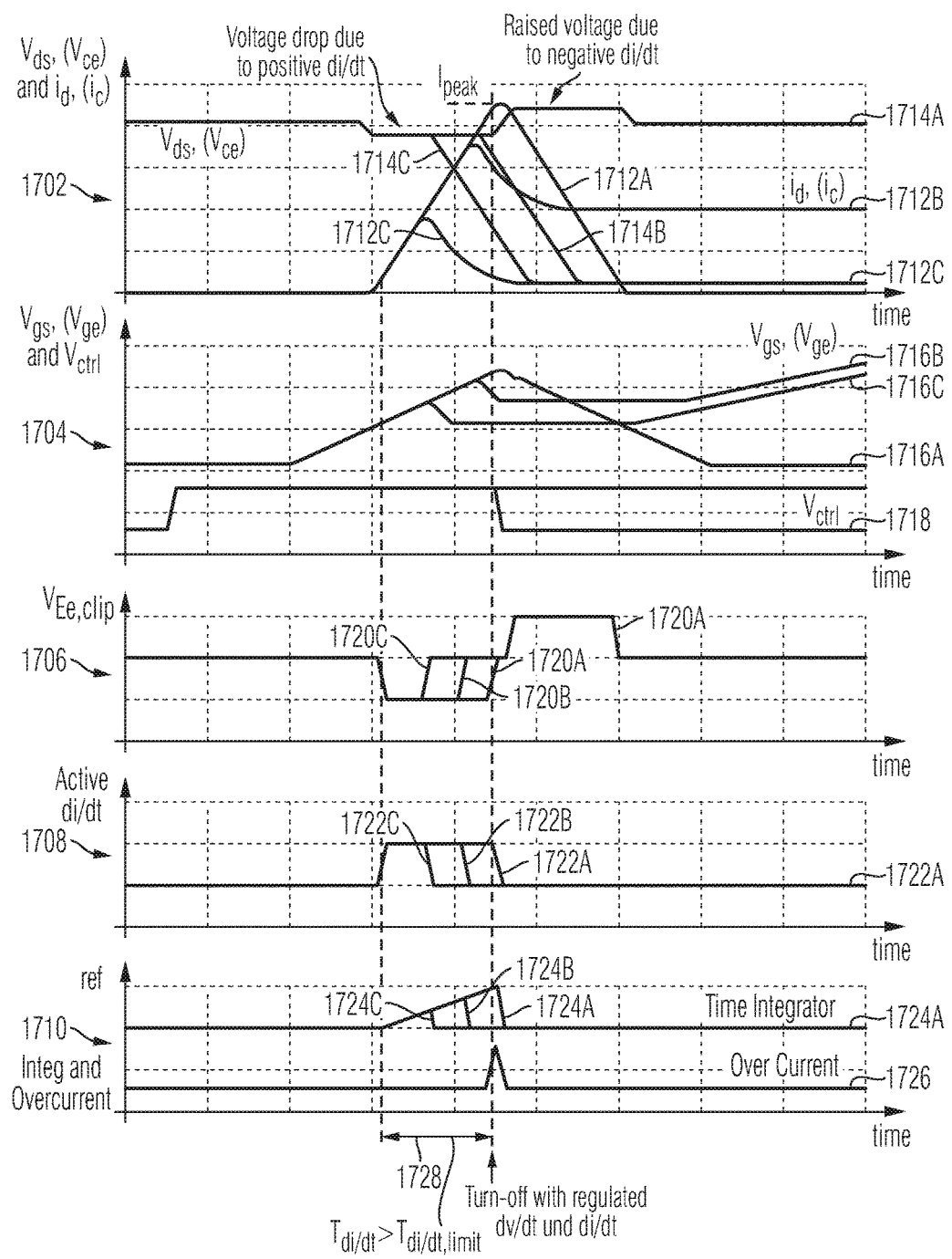
FIG. 17 is a timing diagram of waveforms associated with an over current detection method according to the invention.

FIG. 17 is a timing diagram of waveforms associated with an over current detection method according to embodiments of the invention associated with turn-on of the power switch. A first timing diagram portion 1702 shows drain or collector regulated current waveforms 1712A (high current), 1712B (medium current), and 1712C (low current). Timing diagram portion 1702 also shows drain-to-source or collector-to-emitter regulated voltage waveforms 1714A (high current), 1714B (medium current), and 1714C (low current). The time that the switch is in current regulation up to a peak current value is shown by the $T_{di/dt}$ time interval 1728. A second timing diagram portion 1704 shows the gate-to-source or gate-to-emitter voltage waveforms 1716A (high current), 1716B (medium current), and 1716C (low current), as well as a corresponding control signal 1718 associated with the turn-on event. A third timing diagram portion 1706 shows the clipping voltage waveforms 1720A (high current), 1720B (medium current), and 1720C (low current). A fourth timing diagram portion 1708 shows the active di/dt waveforms 1722A (high current), 1722B (medium current), and 1722C (low current). A fifth timing diagram portion 1710 shows time integrator waveforms 1724A (high current), 1724B (medium current), and 1724C (low current). Timing diagram portion 1710 also shows the over current signal 1726 associated with time interval 1728 extending beyond the limit time interval due to high current flowing through the power switch.

Figure 18:
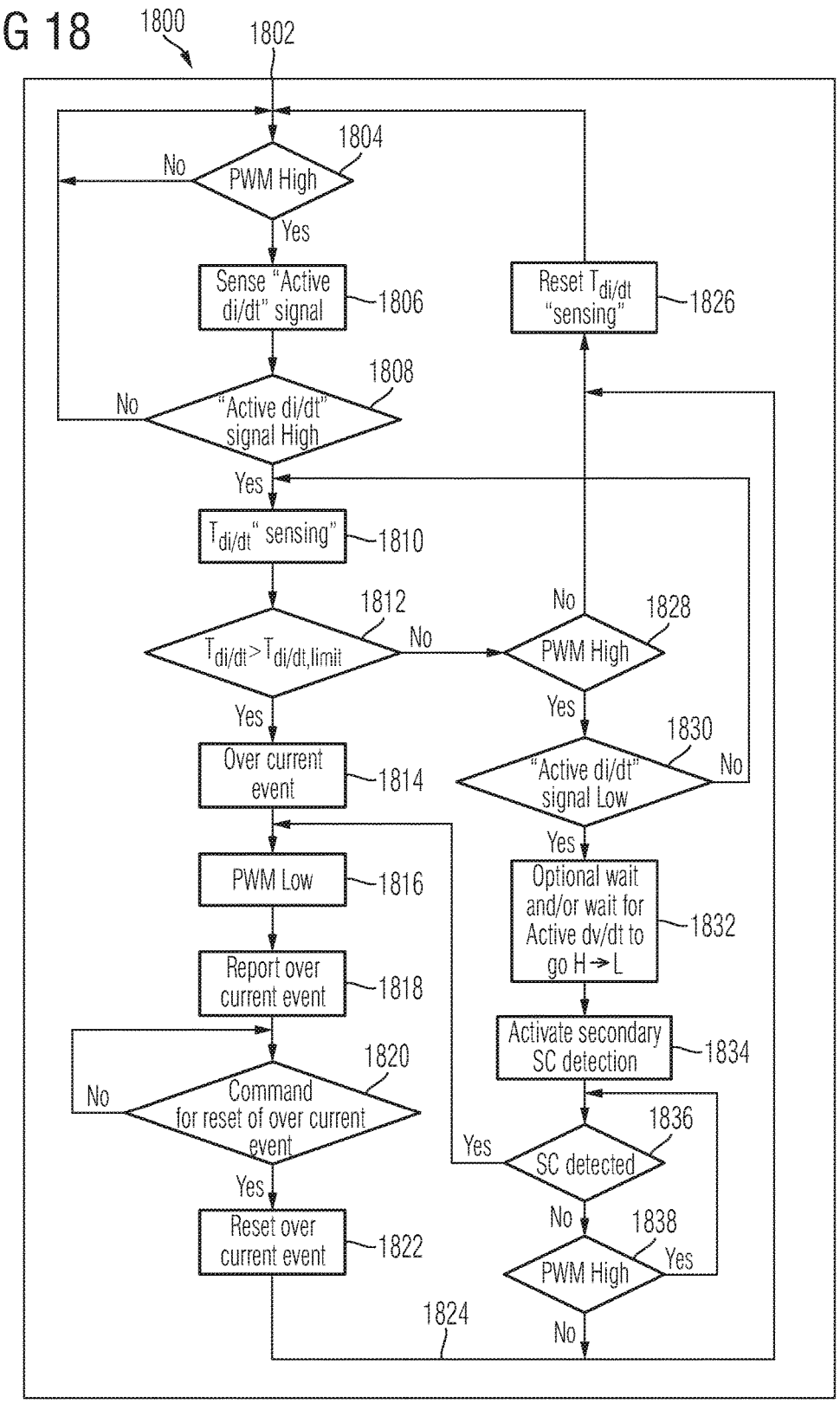
FIG. 18 is a flow diagram of an over current detection method according to the invention.

FIG. 18 is a flow diagram 1800 of an over current detection method for use during a start-up condition of a power switch according to embodiments of the invention. The method starts at 1802 and interrogates whether or not the PWM signal associated with the power switch is active at 1804. If no, the method returns to 1802 and if yes, the method senses the active di/dt signal at 1806. At 1808 the method interrogates whether or not the active di/dt signal is high. If no, the method returns to 1802, and if yes, the time associated with the di/dt signal being active is sensed at 1810. At 1812 the method interrogates whether or not the time the di/dt signal is active is greater than a time limit. If no, method steps are taken that will be explained in greater detail below. If yes, the method determines at step 1814 that an over current event has occurred. The PWM signal for the power switch circuit is set low at step 1816. An over current event is reported to a system supervising the power switch at step 1818. At step 1820 the method waits for a reset command associated with the over current event. Once received, the method resets at 1822 and continues via 1824 to 1826. There the $T_{di/dt}$ sensing is reset and then the method returns to 1802 and is ready for a next turn-on and sensing. Returning to 1812, if the di/dt active time limit has not been reach, the method interrogates whether or not the PWM signal is high at 1828. If no, the time sensing of the active di/dt signal is reset at 1826 and the method returns to 1802. If yes, the method interrogates whether or not the active di/dt signal has gone low. If no, the method returns to step 1810. If yes, the method waits for a given time and/or waits for the active dv/dt signal to go from high to low. Once the waiting time is over and/or the active dv/dt signal goes low, secondary short circuit protection can be activated at step 1834 to detect short circuit events happening during the on state of the switch (SC2). At 1836 the method interrogates whether or not a short circuit condition has been detected. If yes, the method returns to step 1816. If not, the method interrogates whether or not the PWM signal is high at 1838. If yes, the method returns to 1836 and if no, the method continues to 1824. The method further continues to 1826 and resets $T_{di/dt}$ sensing and then returns to 1802 and is ready for a next turn-on and sensing.

Figure 19:
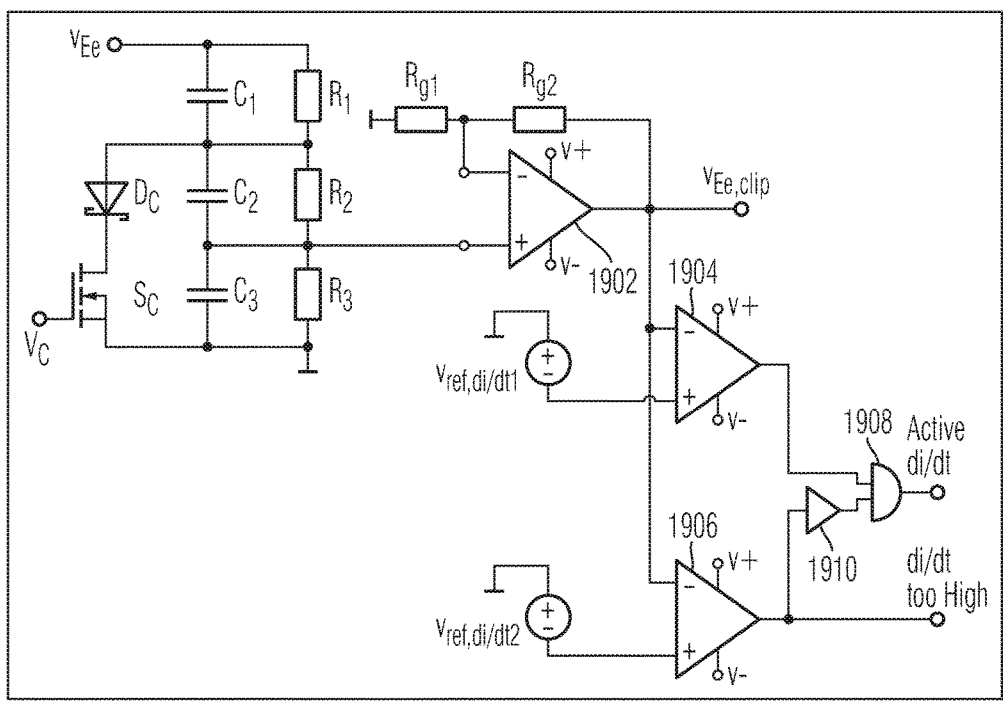
FIG. 19 is a schematic diagram of an active di/dt regulation detector including window detection and a "too high" di/dt detection according to an embodiment of the invention.

To add more layers of security, an additional comparator can be added to create a window detection of the di/dt. This additional comparator 1906 can be seen in FIG. 19. FIG. 19 roughly corresponds to the previously described circuit in FIG. 15. Amplifier 1902 corresponds to amplifier 1502, and comparator 1904 corresponds to comparator 1504. Also shown in FIG. 19 is inverter 1910 coupled to comparator 1906, and AND gate 1908 for generating the active di/dt signal. The output of comparator 1906 generates an additional signal described below. Note the first and second reference voltages associated with comparators 1904 and 1906.

By adding window detection the active di/dt signal will only go high if the signal VEs,clip previously described is within a defined voltage window.

$$V_{ref,di/dt1} < -V_{Ee,clip\ target} < V_{ref,di/dt2} \quad \text{Eq 3}$$

And additionally, a signal "di/dt too high" associated with the output of comparator 1906 can be created that will indicate if di/dt is out of regulation and also higher than expected. The time which this signal is high can also be measured and if it is longer than a predefined value the driver can take the decision to turn off the driven switch and report a faulty behavior.

Figure 20:
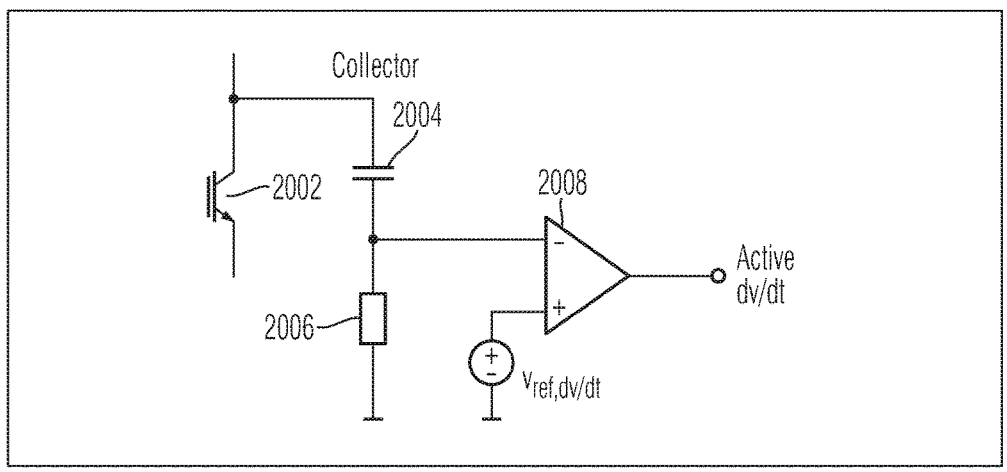
FIG. 20 is a schematic diagram of an active dv/dt regulation detector according to an embodiment of the invention.

To detect the active dv/dt regulation time an additional circuit can be added to the existing power switch circuit, as is shown in circuit 2000 in FIG. 20. Circuit 2000 includes a capacitor 2004 coupled between the collector of the driven switch 2002 and a resistor 2006 coupled to a voltage related to the emitter potential of the driven switch 2002. Since dv/dt is regulated, the voltage across resistor 2006 will be a DC voltage value during regulation. During turn-off, a displacement current will flow from the collector through the capacitor 2004 and the resistor 2006, creating a positive voltage over the resistor 2006. If this voltage is sufficiently above a reference voltage, $V_{ref,dv/dt}$, an active dv/dt signal is generated by comparator 2008. This signal is an indication that dv/dt is in regulation. The time measuring circuits can be of the same kind used for the di/dt. Similar window circuitry can be used for the active dv/dt signal as previously described with respect to the active di/dt signal.

Figure 21:
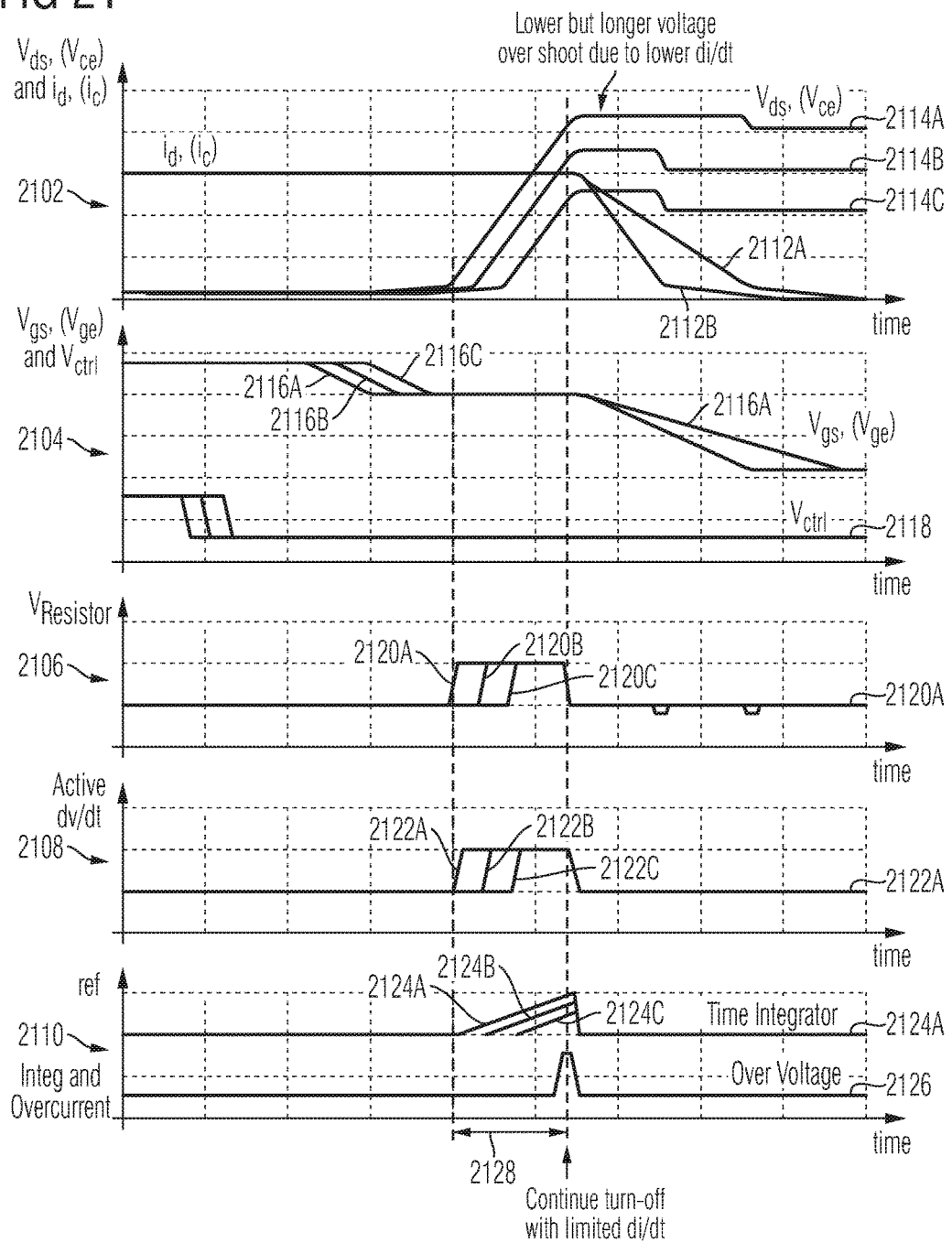
FIG. 21 is a timing diagrams of waveforms associated with an over voltage detection method according to the invention.

FIG. 21 is a timing diagram of waveforms associated with an over voltage detection method according to embodiments of the invention associated with turn-off of the power switch. A first timing diagram portion 2102 shows drain or collector regulated current waveforms 2112A (high voltage) and 2112B (low and medium voltage). Timing diagram portion 2102 also shows drain-to-source or collector-to-emitter regulated voltage waveforms 2114A (high voltage), 2114B (medium voltage), and 2114C (low voltage). The time that the switch is in current regulation up to a peak voltage value is shown by the $T_{dv/dt}$ time interval 2128. A second timing diagram portion 2104 shows the gate-to-source or gate-to-emitter voltage waveforms 2116A (high voltage), 2116B (medium voltage), and 2116C (low voltage), as well as a corresponding control signal 2118 associated with the turn-off event. A third timing diagram portion 2106 shows the resistor voltage waveforms 2120A (high voltage), 2120B (medium voltage), and 2120C (low voltage). A fourth timing diagram portion 2108 shows the active dv/dt waveforms 2122A (high voltage), 2122B (medium voltage), and 2122C (low voltage). A fifth timing diagram portion 2110 shows time integrator waveforms 2124A (high voltage), 2124B (medium voltage), and 2124C (low voltage). Timing diagram portion 2110 also shows the over voltage signal 2126 associated with time interval 2128 extending beyond the limit time interval due to a high voltage across the power switch.

Figure 22:
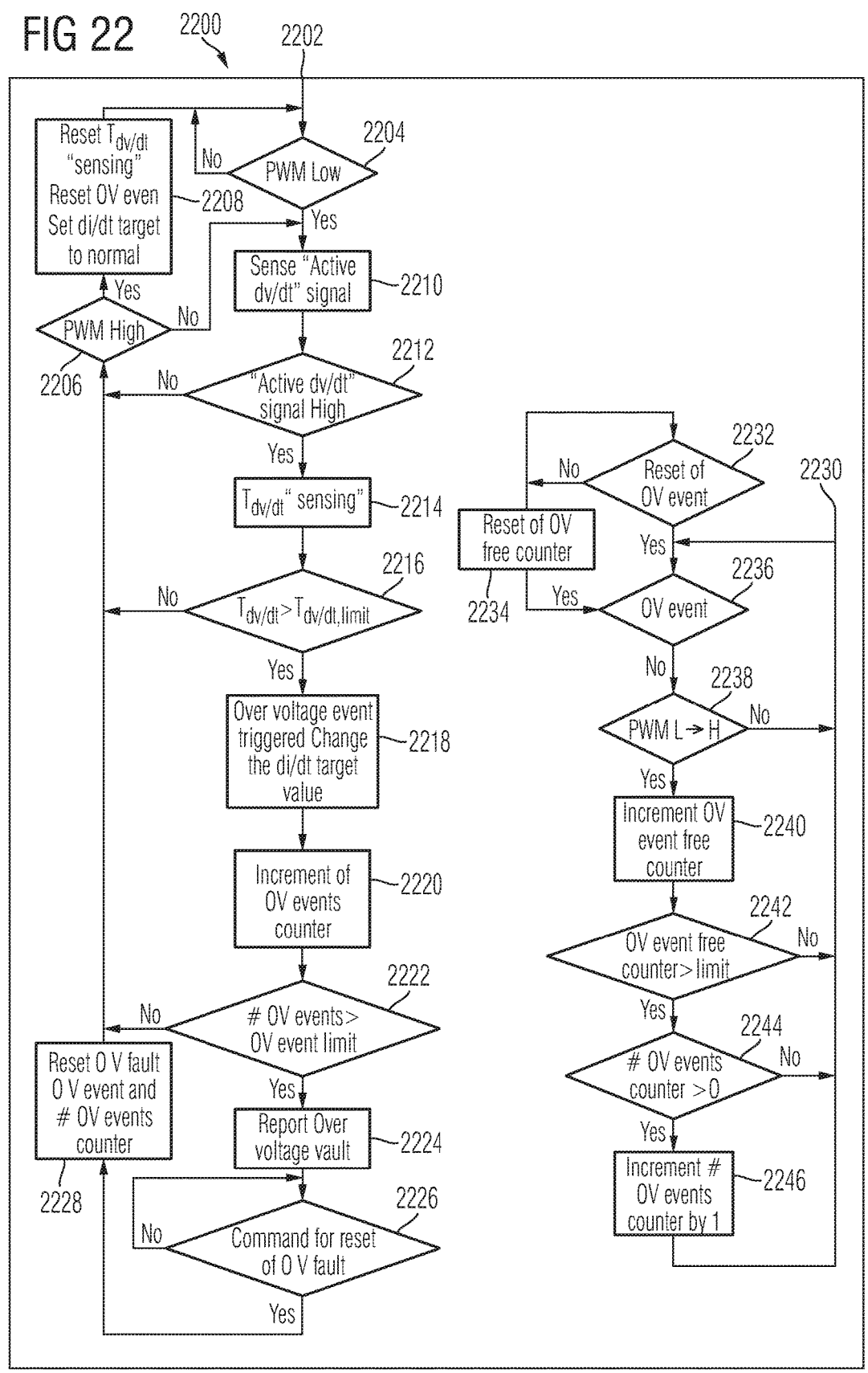
FIG. 22 is a flow diagram of an over voltage detection method according to the invention.

FIG. 22 is a flow diagram 2200 of an over voltage detection method for use during a turn-off condition of a power switch according to embodiments of the invention. The method starts at 2202 and interrogates whether or not the PWM signal associated with the power switch is active at 2204. If no, the method returns to 2202 and if yes, the method senses the active dv/dt signal at 2210. At 2212 the method interrogates whether or not the active dv/dt signal is high. If no, the method returns to 2202 through 2206 and 2208 that are described in further detail below, and if yes, the time associated with the dv/dt signal being active is sensed at 2214. At 2216 the method interrogates whether or not the time the dv/dt signal is active is greater than a time limit. If no, the method returns to 2202 through 2206 and 2208. If yes, the method changes that target regulation value for di/dt at 2218 and increments the number of over voltage events in a counter at 2220. At 2222, the method interrogates whether or not the number of over voltage events is greater than a predetermined over voltage event limit. If no, the method returns to 2202 through 2206 and 2208. If yes, an over voltage fault is reported at 2224. At 2226 the method waits for a command for reset of the over voltage fault. Once the command is received, the method continues at 2228 wherein the over voltage fault is reset, and the counters associated with the over voltage fault are also reset. The method then returns to 2202 through 2206 and 2208.

At 2206, the method interrogates whether or not the PWM signal associated with the power switch is high. If yes, the method continues to 2208 and if no, the method returns to 2210 previously described. Step 2208 resets the $T_{dv/dt}$ time interval, resets the over voltage event counter, and sets the di/dt target value to the nominal value. The method then returns to 2202.

Simultaneously with the over voltage method steps described above, a monitoring sequence of steps is also performed. The monitoring sequence of steps is used, in an embodiment, to ensure that, for example, normal recurring overvoltage indications over PWM switching cycles that would not directly damage the power switch does not cause an immediate over voltage indication. The monitoring method starts at 2230 and interrogates whether or not an over voltage event has occurred at 2236. If yes, an over voltage free counter is reset at 2234, and the method waits for the reset of an over voltage event at 2232. If no, the method interrogates whether or not the PWM signal has gone from low to high at 2238. If no, the method returns to 2230. If yes, the over voltage event free counter is incremented at 2240. At 2242 the method interrogates whether or not the over voltage event free counter is greater than a predetermined limit. If no, the method returns to 2230. If yes, the method interrogates whether or not the over voltage events counter is greater than zero. If no, the method returns to 2230. If yes, the method decrements the over voltage events counter by one and returns to 2230.

Figure 23:
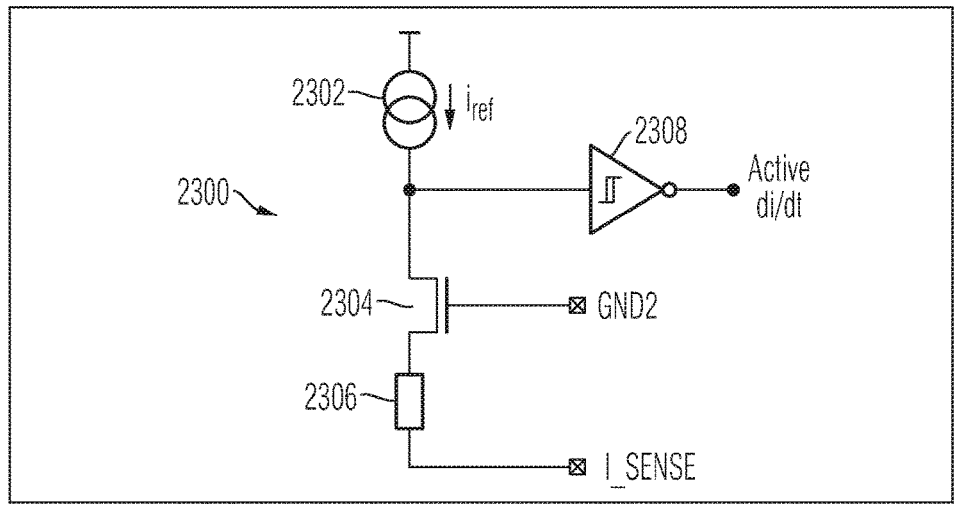
FIG. 23 is a schematic diagram of an active di/dt regulation detector according to an embodiment of the invention.

An alternative current sensing circuit 2300 for generating the active di/dt signal is shown in FIG. 23. Circuit 2300 includes a reference current 2302, transistor 2304 whose gate is coupled to ground, resistor 2306, and an I_SENSE node for receiving the voltage across an inductance in the power switch load path which is a measure of the change of the current through the power switch. The voltage across the gate-source of transistor 2304 and the resistor 2306 will generate a current proportional to the change of current through the power switch. The result of the current comparison between the generated current and the reference current 2302 will change the input voltage to comparator 2308 and generate the active di/dt signal at the output thereof. Circuit 2300 can be duplicated if desired to provide the window detection function previously described.

Figure 24:
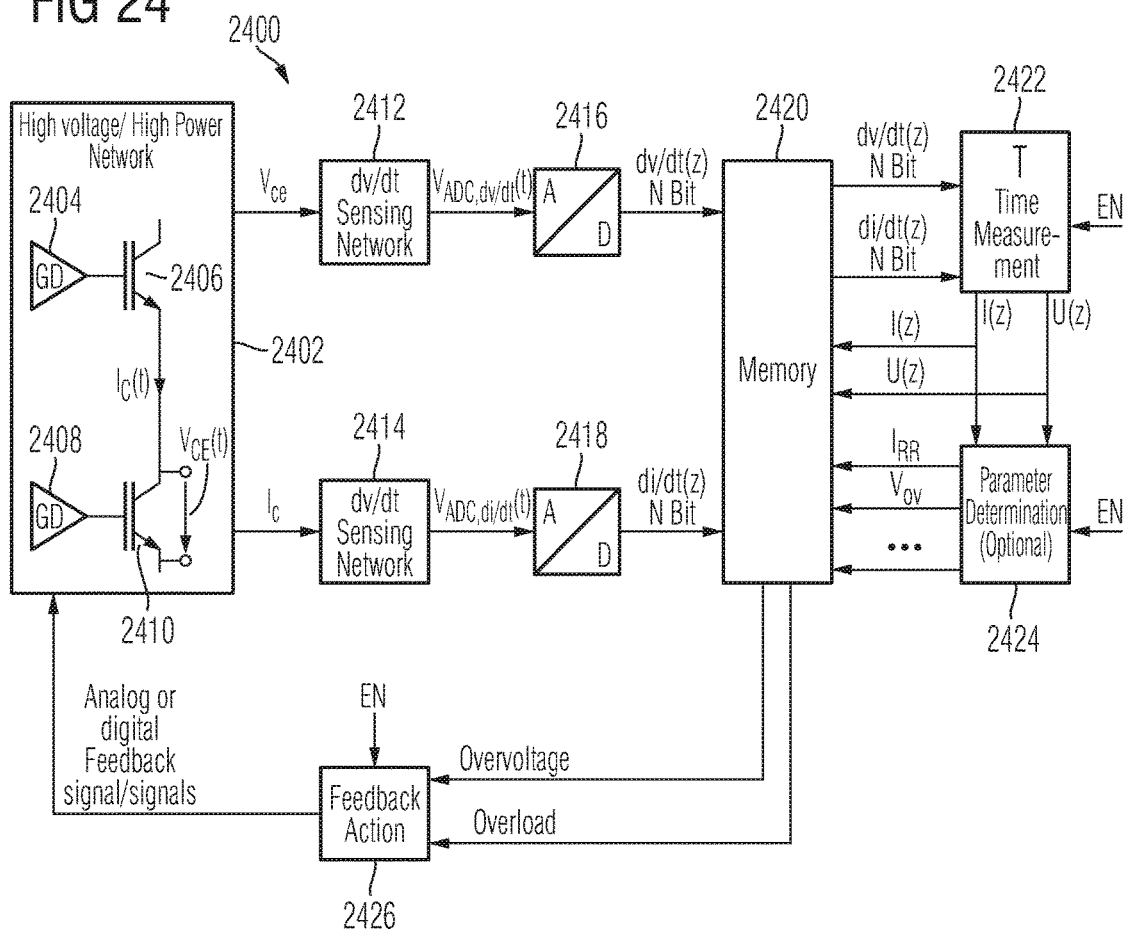
FIG. 24 is a block diagram of a digital path of integration of dv/dt and di/dt according to an embodiment of the invention.

The di/dt and dv/dt regulation and short circuit protection according to an embodiment of the present invention can be generalized in the digital domain as is shown in circuit 2400 of FIG. 24. A high voltage/high power network 2402 is shown including gate drivers 2404 and 2408 for driving power switches 2406 and 2410. The power switches 2404 and 2408 are switched with certain $v_{ce}$ and $i_c$ values. Sensing network 2412 is used to sense the dv/dt information of the $v_{ce}$ signal, and sensing network 2414 is used to sense the di/dt information of the $i_c$ signal. A/D converter 2416 digitizes the voltage output from sensing network 2412 and A/D converter 2418 digitizes the voltage output from sensing network 2418. The digital information is received by memory 2420 and evaluated by 2422. The target level of dv/dt or di/dt is detected as an indication that dv/dt or di/dt is in regulation. The time for which the dv/dt or the di/dt is in regulation is measured and over current or over voltage signals can be triggered according to the principles of embodiments described above. Optional parameter determination can be performed at 2424 to further enhance the short circuit or overload protection of embodiments of the invention. Information regarding the power switch over current and over voltage events can take action on the power switch using a feedback network 2426. As discussed above, the power switch is turned off in the case of an over current event and the di/dt value is changed in the case of an over voltage event.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for protecting a power switch comprising:
   first, second, and third power switch nodes;
   a feedback circuit coupled to at least one of the power switch nodes for regulating a change in current through the power switch;
   a detector circuit coupled to the feedback circuit having an output for indicating that the change in current through the power switch is in regulation; and
   a timing circuit separate from the detector circuit configured for measuring a continuous time duration in which the change in current through the power switch is in regulation, the timing circuit comprising a first input coupled to the output of the detector circuit, a second input configured to be coupled to a reference set to a value based on a predetermined maximum time interval that the change in current through the power switch is in regulation, and an output for generating an over current signal when the continuous time duration is greater than the predetermined maximum time interval,
   wherein the continuous time duration in which the change in current through the power switch is in regulation comprises a length of time that the time derivative of the current through the power switch is continuously greater than a predetermined change in current reference value.

2. The circuit of claim 1, wherein the detector circuit comprises an additional output for identifying a level of regulation of the change in current through the power switch.

3. The circuit of claim 1, further comprising an additional feedback circuit coupled to at least two of the power switch nodes for regulating a change in voltage across the power switch.

4. The circuit of claim 3, further comprising an additional detector circuit coupled to the additional feedback circuit having an output for indicating that the change in voltage across the power switch is in regulation.

5. The circuit of claim 4, wherein the additional detector circuit comprises an additional output for identifying a level of regulation of the change in voltage across the power switch.

6. The circuit of claim 4, further comprising an additional timing circuit coupled to the additional detector circuit.

7. The circuit of claim 6, wherein the additional timing circuit comprises an output for generating an over voltage signal.

8. The circuit of claim 1, further comprising a power switch coupled to the first, second, and third power switch nodes.

9. The circuit of claim 1, wherein the timing circuit comprises a microcontroller configured to digitally count a length of time of a signal at the output of the detector circuit indicates that the change in current through the power switch is in regulation.

10. The circuit of claim 1, wherein the timing circuit comprises a time to digital converter.

11. The circuit of claim 1, wherein the timing circuit comprises a second comparator, a resistor coupled between the first input of the timing circuit and an input of the second comparator, and a capacitor coupled between the input of the second comparator and ground.

12. The circuit of claim 1, wherein the timing circuit comprises a current source, a capacitor, and a second comparator, wherein the current source is controlled by the output of the detector circuit, wherein the current source is configured to charge the capacitor, and wherein the capacitor is coupled to an input of the second comparator.

13. The circuit of claim 1, wherein the detector circuit comprises an operational amplifier for generating a signal corresponding to the change in current through the power switch, and wherein the detector circuit comprises a first comparator separate from the operational amplifier having a first input coupled to an output of the operational amplifier, a second input coupled to the reference set to a change in current reference value, and an output coupled to an output of the detector circuit.

14. The circuit of claim 13, wherein the detector circuit is configured for indicating that the change in current through the power switch is in regulation when the signal at the output of the operational amplifier is greater than the reference set to the change in current reference value.

15. A method for protecting a power switch comprising:
sensing that a change in current through the power switch is in regulation by generating a first signal representative of the change in current through the power switch, and by generating a second signal representative of the first signal being greater than a reference change in current value;
measuring a time that the change in current through the power switch is in regulation;
comparing the time that the change in current through the power switch is in regulation to a reference time; and
generating an over current signal if the time that the change in current through the power switch being in regulation is in excess of the reference time;
wherein a continuous time duration in which the change in current through the power switch is in regulation comprises a length of time that the time derivative of the current through the power switch is continuously greater than a predetermined change in current reference value.

16. The method of claim 15, further comprising turning off the power switch in response to the over current signal.

17. The method of claim 15, wherein sensing that the change in current through the power is in regulation occurs concurrently with a turn-on event.

18. The method of claim 15, further comprising sensing that a voltage across the power switch is in regulation.

* * * * *